United States Patent
Reinhardt et al.

(10) Patent No.: US 10,727,802 B2
(45) Date of Patent: Jul. 28, 2020

(54) METHOD FOR PRODUCING A BATCH OF ACOUSTIC WAVE FILTERS

(71) Applicant: COMMISSARIAT A L'ENERGIE ATOMIQUE ET AUX ENERGIES ALTERNATIVES, Paris (FR)

(72) Inventors: Alexandre Reinhardt, Saint Martin D'Heres (FR); Jean-Baptiste David, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 417 days.

(21) Appl. No.: 15/514,525

(22) PCT Filed: Jun. 29, 2015

(86) PCT No.: PCT/EP2015/064662
§ 371 (c)(1),
(2) Date: Mar. 26, 2017

(87) PCT Pub. No.: WO2016/050375
PCT Pub. Date: Apr. 7, 2016

(65) Prior Publication Data
US 2017/0264257 A1 Sep. 14, 2017

(30) Foreign Application Priority Data
Sep. 29, 2014 (FR) ...................................... 14 59210

(51) Int. Cl.
*H03H 3/04* (2006.01)
*H03H 3/00* (2006.01)
(Continued)

(52) U.S. Cl.
CPC ............ *H03H 3/04* (2013.01); *H03H 3/0073* (2013.01); *H03H 3/0076* (2013.01); *H03H 7/38* (2013.01);
(Continued)

(58) Field of Classification Search
CPC ............ H03H 3/04; H03H 9/64; H03H 9/725; H03H 2003/0464; H03H 2003/0478;
(Continued)

(56) References Cited

U.S. PATENT DOCUMENTS 5,789,845 A * 8/1998 Wadaka ................. H03B 5/326
310/334
6,081,171 A * 6/2000 Ella ...................... H03H 9/0095
310/348
(Continued)

FOREIGN PATENT DOCUMENTS

FR        2 996 061 A1    3/2014
WO       2010/116011 A1   10/2010

OTHER PUBLICATIONS

Tomoya Komatsu et al., "Tunable Radio-Frequency Filters Using Acoustic Wave Resonators and Variable Capacitors," Japanese Journal of Applied Physics, vol. 49, No. 7, Jul. 1, 2010, pp. 07HD24, XP055033634.
(Continued)

*Primary Examiner* — Peter Dungba Vo
*Assistant Examiner* — Kaying Kue
(74) *Attorney, Agent, or Firm* — Baker & Hostetler LLP

(57) ABSTRACT

A method for the batch production of acoustic wave filters comprises: synthesizing N theoretical filters, each filter defined by a set of j theoretical resonator(s) having a triplet $C_{0ij,eq}$, $\omega_{rij,eq}$ and $\omega_{aij,eq}$, these parameters grouped into subsets; determining a reference resonator structure for each subset, naturally having a resonant frequency $\omega_{r,ref}$, where
(Continued)

US 10,727,802 B2
Page 2

$\omega_{aij,eq} < \omega_{r,ref} < \omega_{rij,eq}$; determining, for each theoretical resonator, an elementary building block comprising an intermediate resonator $R'_{ij}$, a parallel reactance $Xp_{ij}$ and/or a series reactance $Xs_{ij}$, the intermediate resonator $R'_{ij}$ having a triplet $C_{0ij}$, $\omega_{r,ref}$ and $\omega_{a,ref}$, the parameters $C_{0ij}$, $Xpij$ and/or $Xs_{ij}$ defined so the elementary building block has a triplet: $C_{0ij,eq}$, $\omega_{rij,eq}$ and $\omega_{aij,eq}$; determining the geometrical dimensions of the actual resonators $R_{ij}$ of the filters so they have a capacitance $C_{0ij}$; producing each actual resonator; associating series and/or parallel reactances with actual resonators in order to form the elementary building blocks.

3 Claims, 12 Drawing Sheets

(51) Int. Cl.
| | |
|---|---|
| H03H 3/007 | (2006.01) |
| H03H 9/54 | (2006.01) |
| H03H 9/56 | (2006.01) |
| H03H 9/70 | (2006.01) |
| H03H 9/72 | (2006.01) |
| H03H 7/38 | (2006.01) |
| H03H 9/64 | (2006.01) |
| H03H 3/02 | (2006.01) |
| H03H 9/02 | (2006.01) |

(52) U.S. Cl.
CPC ............ *H03H 9/542* (2013.01); *H03H 9/545* (2013.01); *H03H 9/568* (2013.01); *H03H 9/64* (2013.01); *H03H 9/70* (2013.01); *H03H 9/706* (2013.01); *H03H 9/725* (2013.01); *H03H 9/6403* (2013.01); *H03H 2003/0071* (2013.01); *H03H 2003/027* (2013.01); *H03H 2003/0464* (2013.01); *H03H 2003/0471* (2013.01); *H03H 2003/0478* (2013.01); *H03H 2009/02165* (2013.01); *H03H 2009/02173* (2013.01); *H03H 2009/02196* (2013.01); *H03H 2009/02204* (2013.01); *H03H 2009/02496* (2013.01); *H03H 2210/012* (2013.01); *H03H 2210/023* (2013.01); *H03H 2210/033* (2013.01)

(58) Field of Classification Search
CPC .... H03H 3/0073; H03H 3/0076; H03H 9/545; H03H 9/568; H03H 9/706; H03H 9/542; H03H 9/70; H03H 9/6403; H03H 2003/0071; H03H 2003/027; H03H 2003/0471; H03H 2009/02165; H03H 2009/02204; H03H 2210/012; H03H 2210/033
USPC ..................... 29/593, 594, 609.1, 601, 25.35
See application file for complete search history.

(56) References Cited

U.S. PATENT DOCUMENTS

| | | | | | |
|---|---|---|---|---|---|
| 6,437,667 | B1* | 8/2002 | Barber | ...................... | H03H 3/04 310/312 |
| 6,518,860 | B2* | 2/2003 | Ella | ........................ | H03H 3/04 29/25.35 |
| 7,135,940 | B2* | 11/2006 | Kawakubo | ............. | H03H 9/542 333/17.1 |
| 7,961,066 | B2* | 6/2011 | Heinze | ................. | H03H 9/0095 310/322 |
| 8,291,559 | B2* | 10/2012 | Heinze | ..................... | H03H 3/04 29/25.35 |
| 8,306,499 | B2* | 11/2012 | Yamakawa | .......... | H03H 7/0153 455/307 |
| 9,041,484 | B2* | 5/2015 | Burgener | ............... | H03H 9/542 333/101 |
| 9,705,473 | B2* | 7/2017 | David | ...................... | H03H 7/38 |
| 10,298,207 | B2* | 5/2019 | Freisleben | ............. | H03H 9/542 |
| 2004/0212453 | A1* | 10/2004 | Tsutsumi | ............. | H03H 9/0038 333/133 |
| 2005/0212612 | A1* | 9/2005 | Kawakubo | ............. | H03H 9/542 331/117 R |
| 2010/0007444 | A1* | 1/2010 | Nordin | ................. | G01N 29/022 333/195 |
| 2010/0212127 | A1* | 8/2010 | Heinze | ..................... | H03H 3/04 29/25.35 |
| 2011/0210802 | A1* | 9/2011 | Ballandras | ............. | H03H 9/172 331/158 |
| 2012/0256705 | A1* | 10/2012 | Bernier | .................... | H03H 7/01 333/187 |
| 2012/0313731 | A1* | 12/2012 | Burgener | ............... | H03H 9/542 333/188 |
| 2014/0125432 | A1* | 5/2014 | Stephanou | ............... | H03H 3/02 333/188 |
| 2014/0340173 | A1* | 11/2014 | Burgener | ................. | H01O 1/50 333/188 |
| 2016/0094199 | A1* | 3/2016 | David | .................... | H03H 9/545 333/133 |

OTHER PUBLICATIONS

Yahya Lakys et al., "Cognitive and encrypted communications, Part 1: State of the art for frequency-agile filters," IEEE International Conference on Electrical and Electronics Engineering, Nov. 5, 2009, pp. 1-15, XP031581343.

K.M. Lakin et al., "Filter banks implemented with integrated thin film resonators," Proceedings of the 2000 IEEE Ultrasonics Symposium, 2000, pp. 851-854.

Nam et al., "Monolithic 1-chip FBAR duplexer for W-CDMA handsets," Sensors and Actuators A, vol. 143, 2008, pp. 162-169.

F. Martin et al., "Re-growth of c-axis oriented AlN thin films," Proceedings of the 2004 IEEE Ultrasonics Symposium, 2004, pp. 169-172.

A. Reinhardt et al., "Multiple-frequency solidly mounted BAW filters," Proceedings of the 2011 International Frequency Control Symposium.

K. Y. Hashimoto et al., "Tunable RF SAW/BAW filters: dream or reality?" 2011 Joint Conference of the IEEE International Frequency Control Symposium and the European Frequency and Time Forum.

A. Volatier et al., "Technology enhancements for high performance BAW duplexer," Proceedings of the 2013 Joint UFFC, EFTF and PFM Symposium, 2013, pp. 761-764.

M. Kadota et al., "Ultrawide band ladder filter using SH0 plate wave in thin LiNbO3 plate and its application," Proceedings of the 2014 IEEE International Ultrasonics Symposium, pp. 2031-2034.

* cited by examiner

METHOD FOR PRODUCING A BATCH OF ACOUSTIC WAVE FILTERS

CROSS-REFERENCE TO RELATED APPLICATIONS

This application is a National Stage of International patent application PCT/EP2015/064662, filed on Jun. 29, 2015, which claims priority to foreign French patent application No. FR 1459210, filed on Sep. 29, 2014, the disclosures of which are incorporated by reference in their entirety.

FIELD OF THE INVENTION

The field of the invention is that of acoustic wave filters. These filters are widely used in mobile telecommunication systems by virtue of their high degree of compactness and their passive character, combined with low insertion losses and the possibility to ensure a high rate of rejection of signals outside the desired frequency band.

BACKGROUND

The electrical characteristics of a number of electronic components are entirely defined by their geometry in a plane. This is the case with transistors for example. This characteristic affords a high degree of manufacturing versatility, allowing components with very different levels of performance to be combined on one and the same chip. This is not the case however with bulk acoustic wave (BAW) components, the electrical characteristics of which are entirely defined by the nature and the thickness of the stacks of component layers. Even for surface acoustic wave components (SAW), in which case the electrical characteristics are largely defined by the patterns of the electrodes used, the properties of the waves employed have proven to be sensitive to the ratio between the thickness of these electrodes and the wavelength, and hence the frequency. As a result, each filter is currently produced on an individual chip, thereby necessitating a corresponding number of filter chips to be assembled (a modern mobile telephone generally uses about 40 different filters), and requiring complex assembly diagrams.

In order to overcome this issue, multiple solutions have been proposed in order to allow multiple filters to be co-integrated on one and the same chip. Often, the proposed embodiments involve the simultaneous production of the two filters of a duplexer. In this case, the separation between the two target passband bandwidths is actually generally relatively small, and co-integration is justified by the fact that the assembly formed by the two filters must be added to a substrate comprising passive elements allowing transmission and reception channels of the duplexer to be electrically isolated from one another.

In the case of SAW components, the resonator resonant frequency is defined by the period of metallizations taking the form of interdigitated combs which are used to excite the acoustic waves on the surface of piezoelectric substrates. The excitation of the acoustic waves occurs specifically when the synchronism condition $p=\lambda/2=V/(2f)$ (where p is the period of the interdigitated electrodes, $\lambda$ is the wavelength, V is the speed of propagation of the surface wave and f is the frequency) is satisfied.

In order to produce filters at different frequencies, those skilled in the art will therefore use different electrode periods in order to position the various components at different frequencies. Use will also be made of the anisotropy of the piezoelectric substrates employed in order to benefit from optimal propagation conditions for the purpose of fixing the electromechanical coupling coefficients of the resonators (which defines the bandwidth of each filter) and their temperature drift. Nevertheless, all of these properties are also heavily influenced by the ratio between the thickness of the metallizations and the wavelength, the presence of a metal layer making the surface waves dispersive. As long as the spacing in terms of frequency between the various filters to be produced is relatively small, these frequency dispersion effects remain negligible. It is for this reason that some duplexers are based on two filters formed conjointly on one and the same chip. However, if the various filters that it is sought to produce have a substantial frequency coverage, these effects dominate and may therefore affect the performance of some of the filters to be produced.

Regarding bulk acoustic wave filters (BAW), a first solution proposed in the literature consists of using a reference filter, generally that which will have the highest center frequency. This filter is made from two sets of bulk wave resonators having slightly offset resonant frequencies, thereby allowing a bandpass circuit to be synthesized on the basis of ladder or lattice filter topologies. In a known manner, the frequency offset between these two types of resonators is obtained by adding an additional layer, referred to as a mass overload, to the resonators located on the parallel branches of the circuits in order to lower their resonant frequency with respect to the resonators on the series branches. The second filter will subsequently be produced by using the same principle of lowering the frequency, i.e. by adding an additional layer localized below the filter covering the lowest frequency band. This principle is illustrated in FIG. 1.

This solution was initially proposed by Lakin in 2000 in the article: K. M. Lakin, K. T. McCarron, J. Belsick and R. Rose, *Filter banks implemented with integrated thin film resonators*, Proceedings of the 2000 IEEE Ultrasonics Symposium, pp. 851-854 (2000) and it was experimentally demonstrated in 2008 by Nam and described in the article: Nam et al., *Monolithic 1-chip FBAR duplexer for W-CDMA handsets*, Sensors and Actuators A, vol. 143, pp. 162-169 (2008), in which the reception and transmission filters of a duplexer for the WCDMA standard were simultaneously produced. This demonstration uses filters of FBAR (film bulk acoustic resonator) type, but its principle may be directly applied to resonators of SMR (solidly mounted resonator) type.

In order to produce the two filters of a duplexer at the same time, it is in theory necessary to use three mass overload layers, since ultimately a set of four resonators, offset by frequency, must be produced. In their work, the authors of this publication were able to optimize the design of the stacks in order to be able to decrease the number of mass overload layers and thus simplify production. Thus, the stack of the transmission filter differs from that of the reception filter only in the local addition of a "band offset" layer ("band tuning layer" in the original publication). This is illustrated in FIGS. 2a to 2d, which relate to an exemplary embodiment of the two filters of a WCDMA duplexer in the article by Nam et al., *Monolithic 1-chip FBAR duplexer for W-CDMA handsets*, Sensors and Actuators A, vol. 143, pp. 162-169 (2008).

The advantage of this solution is that the extra technological cost associated with its production consists only of a photolithography mask level and a deposition and structuring step. This solution therefore remains very simple to implement. Nevertheless, the addition of an additional layer to certain resonators leads in practice to a decrease in the electromechanical coupling coefficient, which may result in additional insertion losses and/or an undulation of the transmission in the target frequency band, and/or in a decrease in the effective passband bandwidth of the filter thus produced, thereby negatively affecting the performance of the component. This negative effect worsens as the frequency gap between the filters widens, given that a more substantial mass overload must be used in this case. In practice therefore, this solution may be employed only in configurations in which the target frequency coverage is not very wide. In the case of the WCDMA duplexer presented in the reference by Nam et al. mentioned above, the two filters have a relative passband bandwidth of about 3%, and are spaced apart in terms of frequency by 9%. The FBAR structure used is able to tolerate these constraints. Nevertheless, numerous other radiofrequency bands prove to be more problematic.

Teams at the VTT have also demonstrated that effectively covering multiple bands using BAW components involves different thicknesses of piezoelectric material for each of the filters, as described in J. Ellä and H. Pohjonen, *BAW filters having different center frequencies on a single substrate and a method for providing the same*, patent U.S. Pat. No. 6,518,860B2. The constraints on filter synthesis are effectively such that the piezoelectric material used to produce the bulk wave resonators, aluminum nitride, only just has sufficient piezoelectric properties to satisfy them. Regarding dimensions, everything therefore occurs as if it were sought to produce each filter on a different chip. When it comes to manufacture, things get more complex.

A first approach proposed in the patent in question consists of depositing a first layer of piezoelectric material at a thickness corresponding to the smallest of the required thicknesses of material. This layer will subsequently be protected at the places where the filter requiring this thickness will be localized, generally the filter with the highest frequency. Next, another deposition of the piezoelectric material is carried out, resulting in this layer being thickened at the places where it is not protected, i.e. where the filter with the lowest frequency is located.

The feasibility of this approach has been studied by a team at the Swiss Federal Institute of Technology in Lausanne, described in: F. Martin, P. Muralt, M. Cantoni and M. A. Dubois, *Re-growth of c-axis oriented AlN thin films*, Proceedings of the 2004 IEEE Ultrasonics Symposium, pp. 169-172 (2004).

The authors have shown that in practice, this approach of regrowing the layer leads to a decrease in its piezoelectric properties with respect to a direct deposition of an equivalent thickness. They bring to light that this is linked to the fact that, in the case of aluminum nitride (AlN), the added extra thickness exhibits poor crystallinity, or even an inversion of its polarity, thereby leading to a partial nullification of the piezoelectric effect produced by the original layer. This behavior is attributed to a degradation in the surface of the AlN layer caused by the chemical agents used in the cleanroom fabrication process steps (photolithography in particular), which are known for lightly etching the material and for increasing its roughness. This phenomenon is also visible after simply exposing the material to the air after deposition, although the effect is less substantial in this case. This indicates that a simple oxidation or a reaction with the humidity in the air is enough to cause a degradation in the surface and to prevent regrowth that preserves the polarity of the material. This study therefore shows that such an approach, at least in the case of AlN, is not viable.

Those skilled in the art could envisage taking the opposite course to the preceding approach, and envisage depositing the thickest piezoelectric layer first, then locally etching it in order to thin it down to the thickness desired for the filters with the highest frequencies. This has the advantage of preserving the structural integrity of the material. Nevertheless, this approach comes with two critical flaws:

the etching may lead to a roughening of the partially etched layer, which results in a decrease in the quality coefficient of the resonators. Worse, in the case of resonators made of aluminum nitride, the chemical products used for the photolithography and resist removal steps also lead to the state of the surface of the material being degraded;

however, the resonators are very sensitive to the thickness of the piezoelectric layer. Great progress has been made in bringing the techniques of depositing thin piezoelectric (in particular AlN) layers to a satisfactory level in terms of controlling the thickness (currently reaching a level of uncertainty as to the deposited thickness corresponding to a standard deviation of the order of 0.3% of the target thickness). In an approach consisting of locally thinning the piezoelectric layer, the residual dispersion of thickness adds the uncertainties in thickness that are linked to the deposition of the layer to the dispersions due to etching, which are generally relatively substantial, especially in the case of partial etching without a stop layer. Such an approach would therefore lead to substantial frequency dispersions, which would result in drops in manufacturing yield.

In order to overcome the limitations of these latter two approaches, the Technical University of Madrid has proposed an approach that can be applied to AlN BAW resonators by making use of the technological particularities of the stacks commonly used, as described in the international patent application by E. Iborra, M. Clement, J. Olivares, *Device for filtering bulk acoustic waves*, WO2010/116011 A1 (2010).

The principle of this approach consists of first depositing a first piezoelectric layer of aluminum nitride, then of covering it with a layer acting as a hard mask. This may for example be the metal layer forming the upper electrode. This hard mask will subsequently be defined in order to remove it from the places where it will be desired to produce the other series of filters. The aluminum nitride will subsequently be etched in order to leave only islands on which the first series of filters will be produced. A second layer of aluminum nitride will subsequently be deposited, aiming for a thickness corresponding to the second series of filters. This second layer is once more covered with a hard mask, which is in turn defined in order to clear the spaces where there will be no need for the second thickness of piezoelectric material. The second layer of aluminum nitride is then etched. At this stage, the etch will abut either the first hard mask, thereby allowing the second layer of AlN to be removed and the remaining island of the first layer to be protected; or the second hard mask, thereby protecting the second layer of AlN, which has been deposited on an area from which the first layer has already been removed beforehand. Islands having different thicknesses are thus formed. The process may then be repeated over and over again. It is then sufficient to etch the hard masks by making use of the selectivity of etching between these masks and AlN, thereby ensuring that the piezoelectric layers will not be degraded. In the case in which this hard mask is made from metal layers forming the upper electrodes (made of Mo in the patent in question), this etching step may be directly used to form the patterns of the upper electrodes. If this is done by means of reactive dry etching using fluorinated gases, the method is extremely selective with respect to the aluminum nitride layer, thereby allowing different thicknesses to be accommodated on each of the islands without affecting the production process.

This approach has been experimentally validated by the applicant and described in the article: A. Reinhardt, J. B. David, C. Fuchs, M. Clement, J. Olivares, E. Iborra, N. Rimmer, S. Burgess, *Multiple-frequency solidly mounted BAW filters*, Proceedings of the 2011 International Frequency Control Symposium, shortly afterward by taking the case of the two filters of a duplexer for the WCDMA standard. This article shows a cross section of two stacks produced for the various filters, which differ in the thickness of the aluminum nitride layer, namely 1.29 μm for the transmission filter and 1.11 μm for the reception filter. This article also shows the responses of the two conjointly produced filters, as well as the validity of the approach as reprised and illustrated in FIG. 3.

This approach also has a few limitations, however:

it requires a certain number of additional fabrication steps in order to form the islands of piezoelectric layers having different thicknesses. It therefore incurs extra cost to produce which is to be compared with the extra cost of assembling two different chips on one and the same module instead of only one containing the two co-integrated filters;

furthermore, in order to limit the technological cost of this approach, technological stacks should be set up for each filter while attempting to preserve a maximum number of layers of identical thickness between the various filters. For performance-critical applications, technologies based on aluminum nitride may not be capable of affording the designer sufficient freedom to permit such a sharing of layers between various filters, since these properties are only just capable of meeting the specifications of the existing filters.

In view of this observation and faced with the increased number of filters in mobile communication systems, a need remains to identify a technology capable of synthesizing the majority of the bandpass filters required for these systems to operate, allowing a maximum number thereof to be co-integrated on one and the same chip, and ideally without extra technological cost.

One solution to this problem has been indirectly provided by the team of Pr. Hashimoto at the University of Chiba. This team has for several years specifically been interested in the use of resonators with very high electromechanical coupling coefficients for the purpose of producing frequency-agile filters: K. Y. Hashimoto, S. Tanaka, M. Esashi, *Tunable RF SAW/BAW filters: dream or reality?*, 2011 Joint Conference of the IEEE International Frequency Control Symposium and the European Frequency and Time Forum. Specifically, the addition of variable passive elements in series or in parallel with an acoustic resonator allows the resonant and antiresonant frequencies to be shifted as illustrated in FIGS. 4a and 4b.

It is therefore possible to substantially shift the resonant and antiresonant frequencies of a resonator within the limits of the range delimited by the original resonant and antiresonant frequencies, without the capacitive adjustment elements. A very high electromechanical coupling coefficient becomes the necessary condition for very high frequency agility. In order to make use of this principle, filter topologies such as for example those presented in FIG. 5 are used. By deciding to employ SAW resonators having the highest possible electromechanical coupling coefficients (higher than 30% in this instance), these authors have succeeded in designing a filter circuit having a relative bandwidth of 5%, the center frequency of which is capable of varying by 5%.

In order to demonstrate this variable filter principle, in practice the authors produced two separate filters having identical resonators and different capacitance values as described in: T. Komatsu, K. Y. Hashimoto, T. Omori, M. Yamaguchi, *Tunable radio-frequency filters using acoustic wave resonators and variable capacitors*, Japanese Journal of Applied Physics 49, 2010 instead of directly producing a complete frequency-agile filter module. Here they have proposed, in a fortuitous manner, a solution allowing two filters operating at different frequencies to be produced on one and the same chip.

Varying the center frequency of a filter according to this approach, even if it is operable, nonetheless meets with a strict limit. Specifically, the authors at the University of Chiba present, as illustrated in FIG. 6, two filters with 5% relative bandwidth, centered at 4 and 9% of a reference frequency. Nevertheless, having based their filter on resonators having an electromechanical coupling coefficient of 30%, a much higher frequency agility, or else a much greater spacing in terms of frequency between the two filters, could be expected.

In practice, in the approach proposed by the team at the University of Chiba, the frequency variation afforded by modifying the capacitance values of the capacitors inserted into the filter circuit is limited by the fact that the characteristic impedance of the resonators is modified by the capacitance value of the capacitors connected in series and in parallel with the resonators, as can be seen in FIGS. 4a and 4b. Thus, as soon as the values of the passive elements are varied substantially for the purpose of increasing the spacing in terms of frequency between the two filters, an electrical mismatch of the filter is very quickly entrained, thereby making it non-operational. This effect is illustrated in FIG. 7, which shows the deterioration in the response of a filter as it is sought to shift its frequency by varying the capacitance values of the capacitors inserted into the filter circuit.

SUMMARY OF THE INVENTION

In this context, the present invention proposes a solution to allow the batch production of multiple acoustic wave filters by using resonators with very high electromechanical coupling coefficients, typically higher than 15% and advantageously higher than 30%, for this purpose, to which reactive elements are added in series and in parallel so as to shift the natural resonant and antiresonant frequencies of these resonators and thus to generate multiple pairs of resonant/antiresonant frequencies making it possible to produce, on the basis of a basic resonator structure common to the filters, filters having different bandwidth and center frequencies.

Nevertheless, in order to avoid being subject to the existing fabrication limitations presented in the article by T. Komatsu, K. Y. Hashimoto, T. Omori, M. Yamaguchi, *Tunable radio-frequency filters using acoustic wave resonators and variable capacitors*, the applicant proposes, in the present invention, the production of elementary building blocks of the filters that it is desired to synthesize, namely the resonator/series reactance/parallel reactance triplets, such that they have the impedances required for the satisfactory operation of the filter into which they will be inserted.

More specifically, a subject of the present invention is a method for the batch production of a set of N filters $F_i$, where $1 \leq i \leq N$, each acoustic wave filter comprising j actual acoustic wave resonators $R_{ij}$, where $1 \leq j \leq M_i$, and comprising center frequencies $f_i$ and bandwidths $I_i$, which are different for at least two of them, characterized in that this method comprises the following steps:

synthesizing N theoretical filters, each filter being defined on the basis of a set of j theoretical resonator(s), where $1 \leq j \leq M_i$, such that said theoretical filters have said center frequencies $f_i$ and said bandwidths $I_i$, the theoretical resonators of each filter respectively having a triplet of parameters: a theoretical static capacitance $C_{0ij,eq}$, a theoretical resonant frequency $\omega_{rij,eq}$ and a theoretical antiresonant frequency $\omega_{aij,eq}$, these parameters being grouped into one or more subsets;

determining a reference resonator structure for each subset such that said reference resonator naturally has a resonant frequency $\omega_{r,ref}$ that is lower than the lowest of the theoretical resonant frequencies $\omega_{rij,eq}$ of said subset and an antiresonant frequency $\omega_{a,ref}$ that is higher than the highest of the theoretical antiresonant frequencies $\omega_{aij,eq}$ of said subset;

determining, subsequent to the preceding step for each theoretical resonator of each subset, an elementary building block comprising an intermediate resonator $R'_{ij}$, a parallel reactance $Xp_{ij}$ and/or a series reactance $Xs_{ij}$, the intermediate resonator $R'_{ij}$ having a static capacitance $C_{0ij}$, a resonant frequency $\omega_{r,ref}$ and an antiresonant frequency $\omega_{a,ref}$, the parameters $C_{0ij}$, Xpij and/or $Xs_{ij}$ being defined such that the elementary building block has a static capacitance that is equal to the theoretical static capacitance $C_{0ij,eq}$, a resonant frequency that is equal to the theoretical resonant frequency $\omega_{rij,eq}$ and an antiresonant frequency that is equal to the theoretical antiresonant frequency $\omega_{aij,eq}$;

determining the geometrical dimensions of the actual resonators $R_{ij}$ of the filters on the basis of the geometrical dimensions of said reference resonator structure such that they respectively have the capacitance $C_{0ij}$ of the intermediate resonator $R'_{ij}$;

producing each of said actual resonators;

associating series and/or parallel reactances with said actual resonators in order to form the elementary building blocks.

According to the present invention, all of the actual resonators of the filters may advantageously be co-integrated on one and the same chip, in an optimal manner, on the basis of a standard basic structure.

According to certain variants of the invention, the elementary building block comprises a reactance connected in parallel which is connected, on the one hand, to an input/output terminal and, on the other hand, to an intermediate node between the resonator and a reactance connected in series.

According to certain variants of the invention, the elementary building block comprises a reactance connected in parallel with the series reactance/resonator assembly.

According to certain variants of the invention, the filters comprise elementary building blocks connected in series and elementary building blocks connected in parallel.

According to certain variants of the invention, as the resonators are bulk wave resonators, the method comprises:

producing at least one stack comprising a lower electrode layer, a piezoelectric material layer and an upper electrode layer allowing the reference design resonator to be defined;

determining the geometrical dimensions of the active area of the actual resonators.

According to certain variants of the invention, the method comprises the production of multiple stacks formed on the basis of one and the same piezoelectric layer or multiple piezoelectric layers.

In the case of using multiple piezoelectric layers, these are preferably adjacent to one another and have different thicknesses, they are associated with respective separate or shared electrode layers.

According to certain variants of the invention, the actual and reference resonators of the elementary building blocks connected in parallel comprise a mass overload with respect to the actual and reference resonators of the elementary building blocks connected in series.

According to certain variants of the invention, the stack comprises a passivation layer in which the thickness allows the mass overloads to be produced.

According to certain variants of the invention, the resonators are surface wave resonators, the method comprises:

defining a reference resonator structure comprising an interdigitated electrode comb structure of period λ;

defining the lengths of interdigitated electrode combs of the same period λ, allowing the sets of j actual resonators to be defined.

According to certain variants of the invention, the actual and reference resonators are produced on a substrate made of $LiNbO_3$, potentially and advantageously having the crystal orientation (YXI)/15°, the electrode combs being made of copper.

According to certain variants of the invention, the resonators are plate wave resonators, the method comprises:

producing a membrane and an interdigitated electrode comb structure of period λ allowing a reference resonator to be defined;

defining the lengths of interdigitated electrode combs of the same period λ, allowing the sets of j actual resonators to be defined.

According to certain variants of the invention, the actual and reference resonators are produced on a substrate made of $LiNbO_3$, potentially and advantageously having the crystal orientation cut (YXI)/30°.

According to certain variants of the invention, the association of series and/or parallel reactances with said actual resonators is carried out on a chip common to said actual resonators and to said reactances.

According to certain variants of the invention, the method comprises:

producing the actual resonators by means of a stack, produced on top of a cavity left free in a substrate;

producing, in proximity to these resonators, the capacitors allowing the resonant and antiresonant frequencies to be positioned on the basis of another stack.

According to certain variants of the invention, the stack forming the resonators and the stack forming the capacitors comprise at least one common layer formed by a piezoelectric layer.

BRIEF DESCRIPTION OF THE DRAWINGS

The invention will be better understood and other advantages will become apparent on reading the following description, which is given by way of non-limiting example, and by virtue of the appended figures in which.

DETAILED DESCRIPTION

In general, as explained above, the applicant proposes the production of elementary building blocks to form the filters that it is desired to synthesize, namely the resonator/series reactance/parallel reactance triplets, such that they have the impedances or admittances (the inverse of impedance) required for the satisfactory operation of the filter into which they will be inserted.

Figure 1:
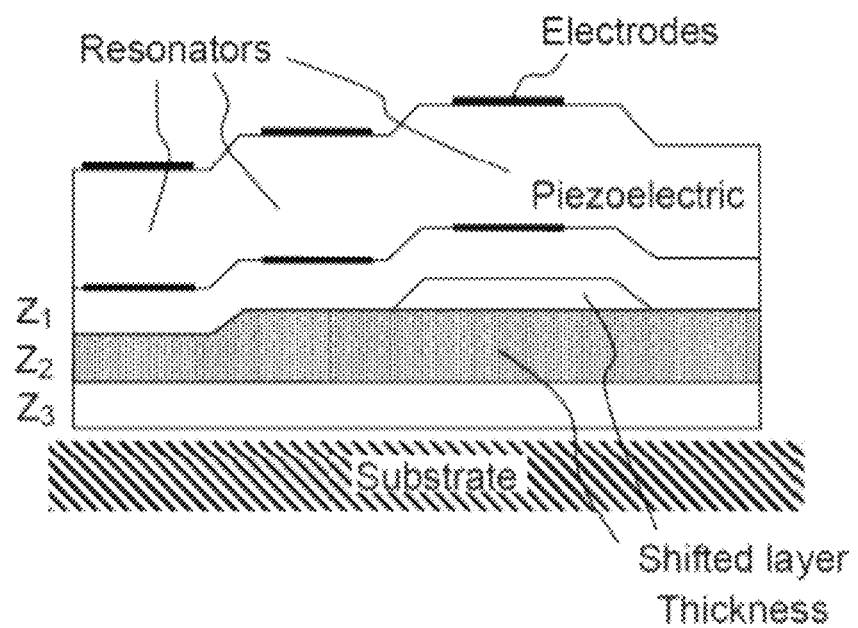
FIG. 1 illustrates the principle of co-integrating two filters by using a mass overload layer in order to lower the center frequency of one thereof, according to the prior art.
Figure 2B:
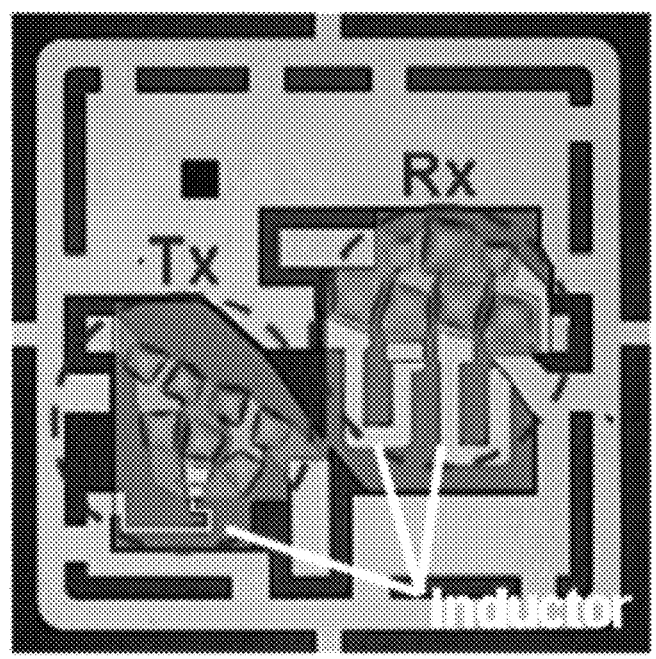
FIGS. 2a to 2d relate to an exemplary embodiment of two filters of a WCDMA duplexer and illustrate stacks of the reception and transmission filters, revealing the addition of an extra layer to the resonators of the transmission filter (FIG. 2a); to an optical photograph of the duplexer thus produced on a single chip (FIG. 2b); to the respective electrical responses of the resonators (FIG. 2c) and the obtained filters (FIG. 2d)
Figure 2A:
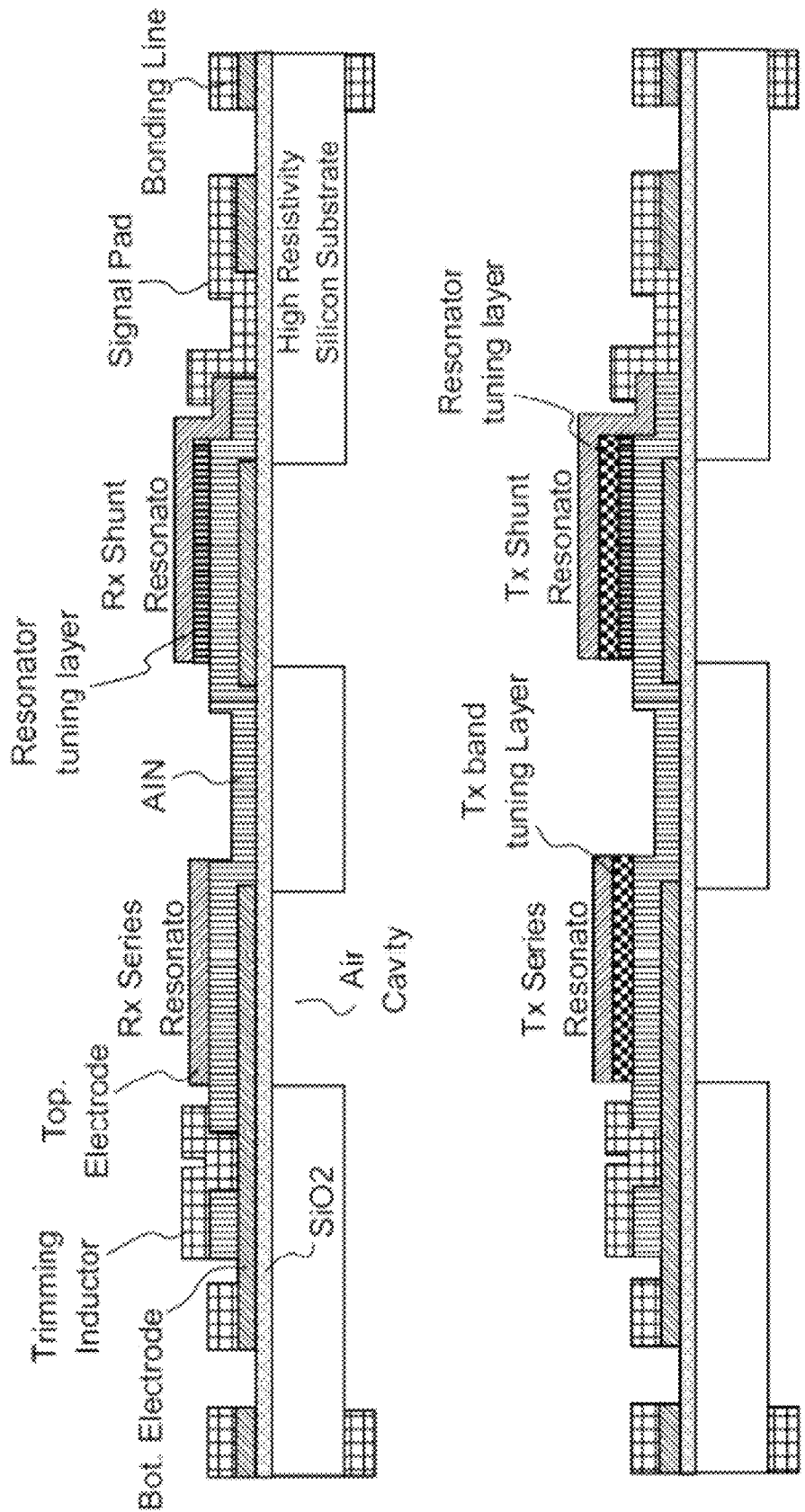
Figure 2C:
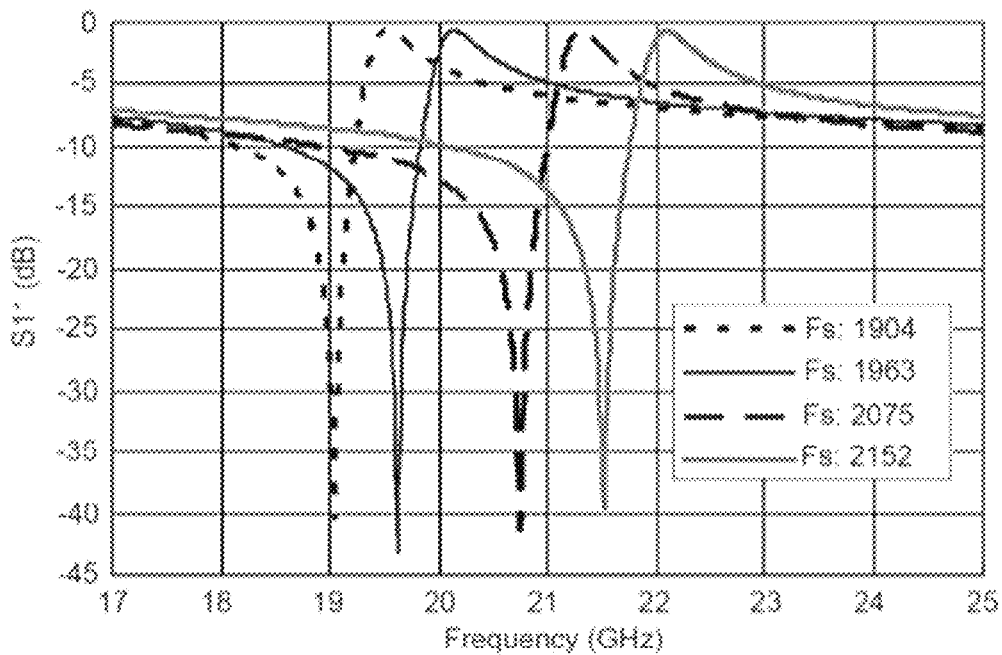
Figure 2D:
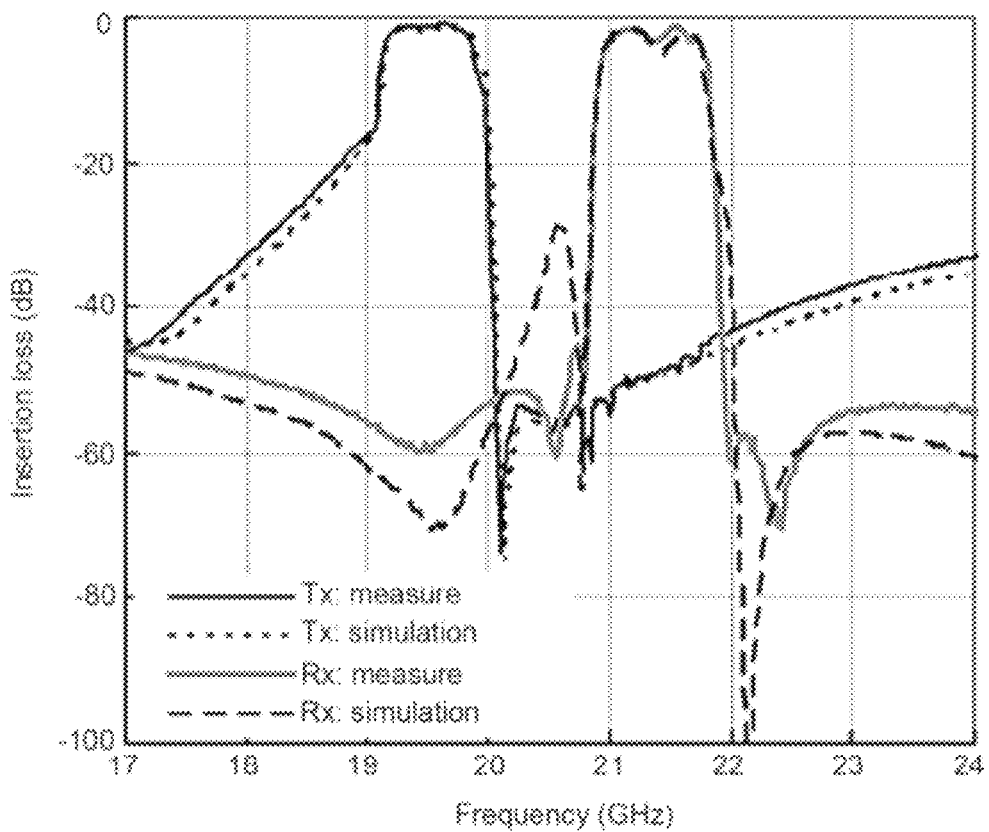
Figure 3:
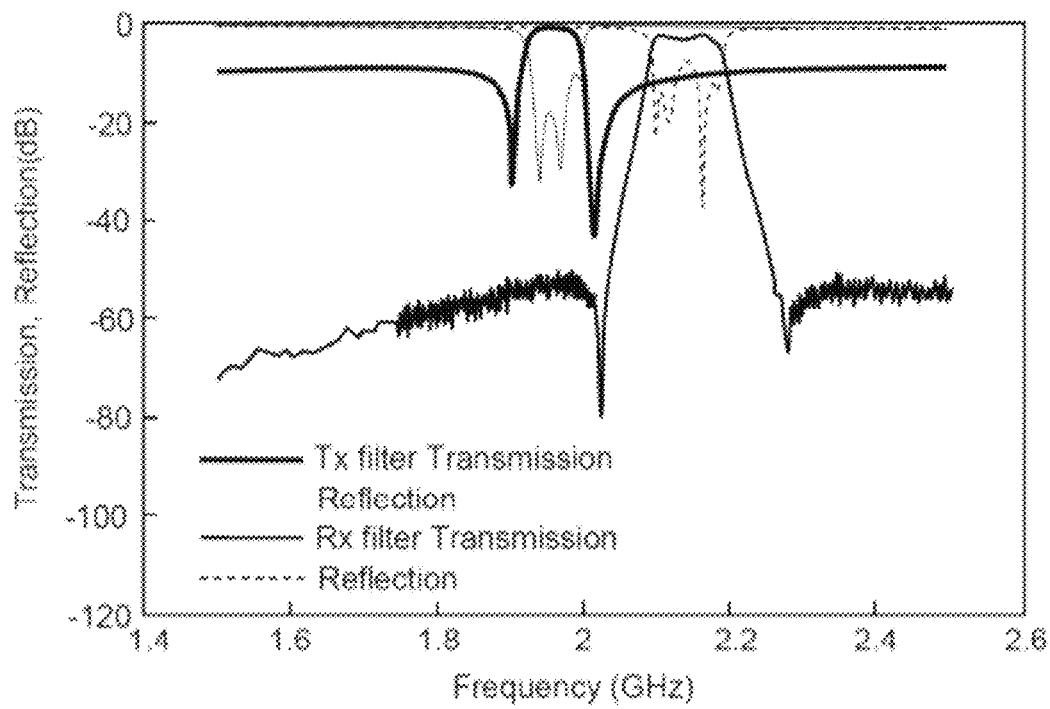
FIG. 3 illustrates the electrical measurement of the co-integrated WCDMA reception and transmission filters according to the article by A. Reinhardt, J. B. David, C. Fuchs, M. Clement, J. Olivares, E. Iborra, N. Rimmer, S. Burgess.
Figure 4A:
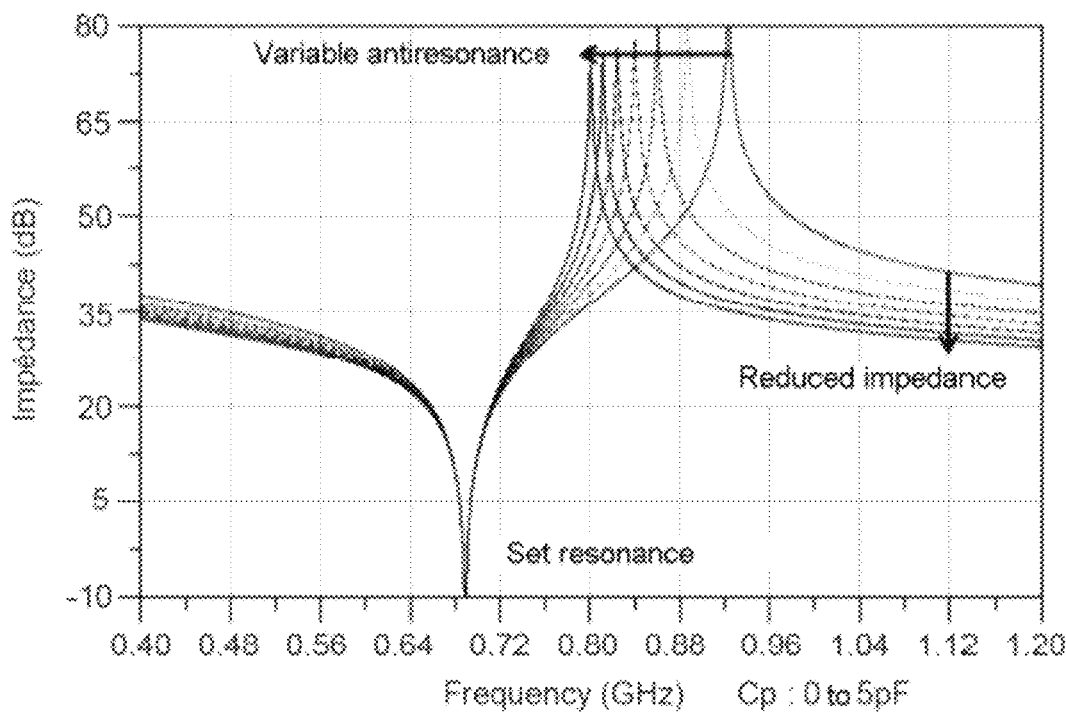
FIGS. 4a and 4b illustrate the effect of a parallel capacitor and of a series capacitor on the electrical response of a resonator according to the prior art.
Figure 4B:
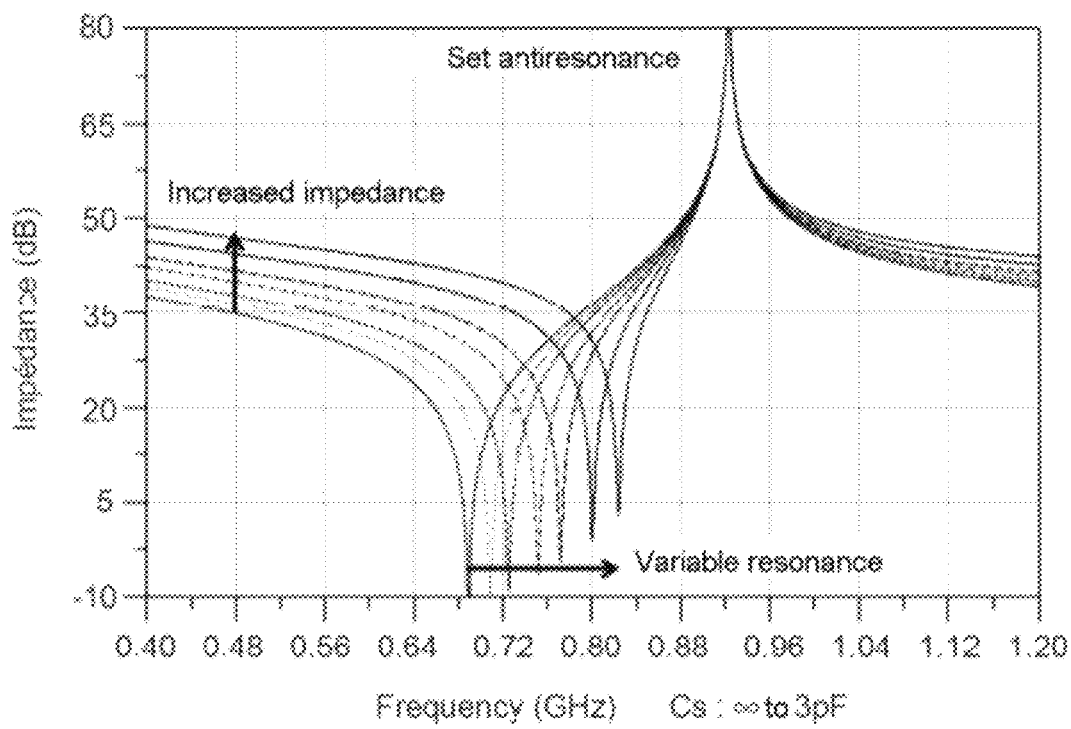
Figure 5:
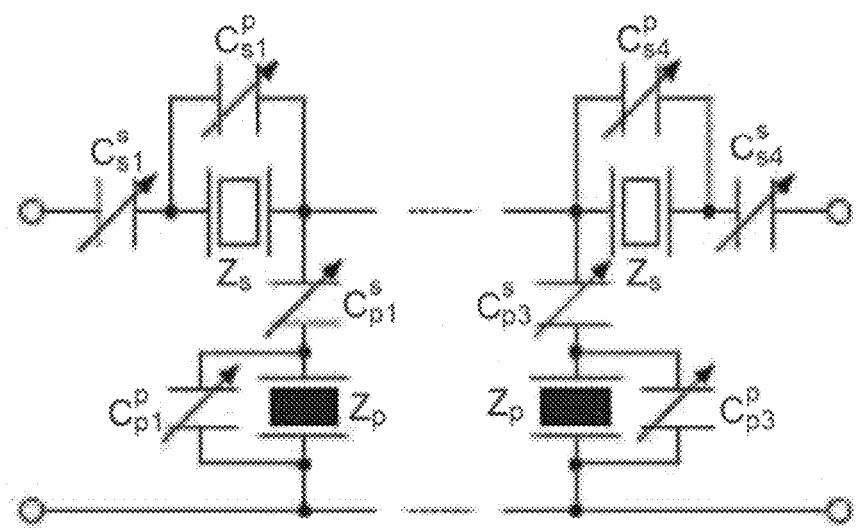
FIG. 5 illustrates the principle of a filter containing resonators to which variable capacitors are added in series and in parallel according to the prior art.
Figure 6:
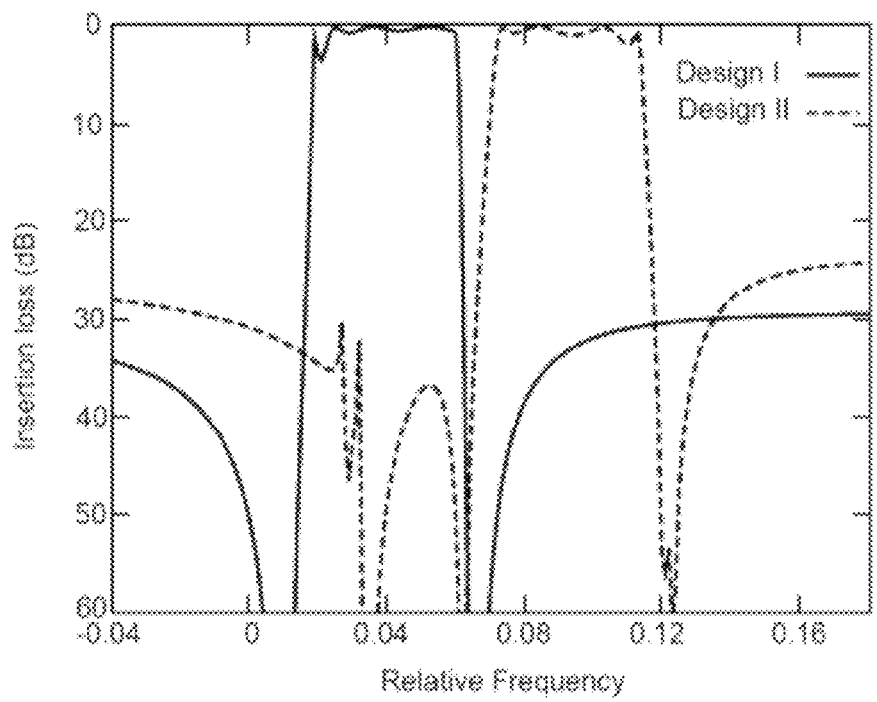
FIG. 6 illustrates examples of filters produced on the basis of the topology illustrated in FIG. 5, obtained by varying the capacitance values of the capacitors of the filter circuit according to the prior art.
Figure 7:
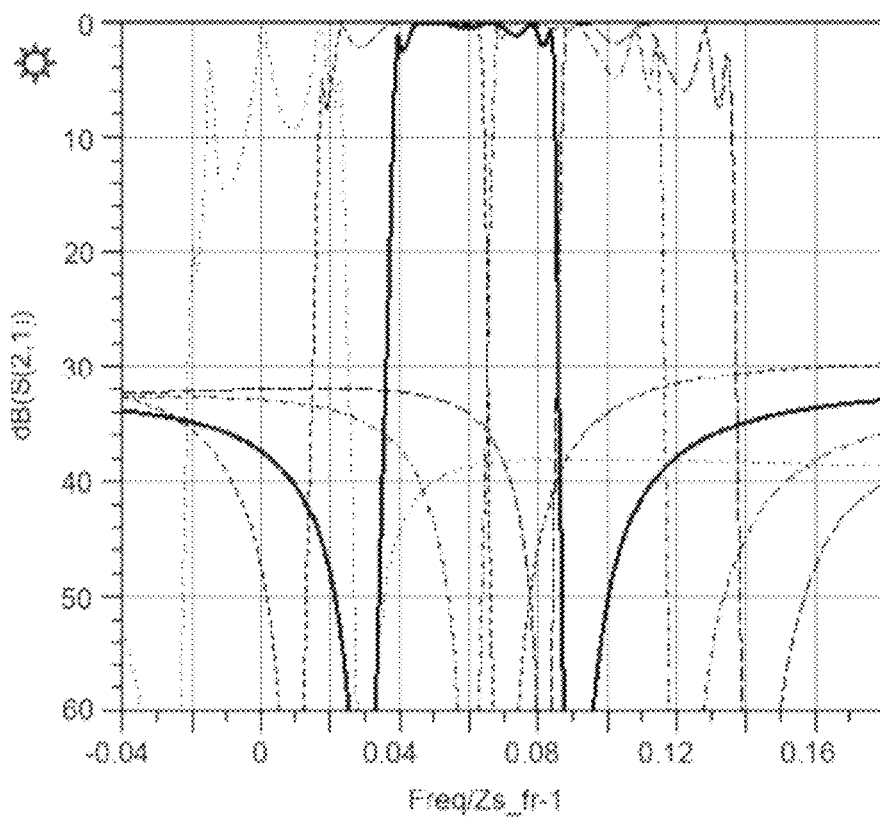
FIG. 7 illustrates the mismatch of the filters when they are centered beyond 0% or 11% of the resonant frequency of the series resonators according to the prior art.
Figure 8:
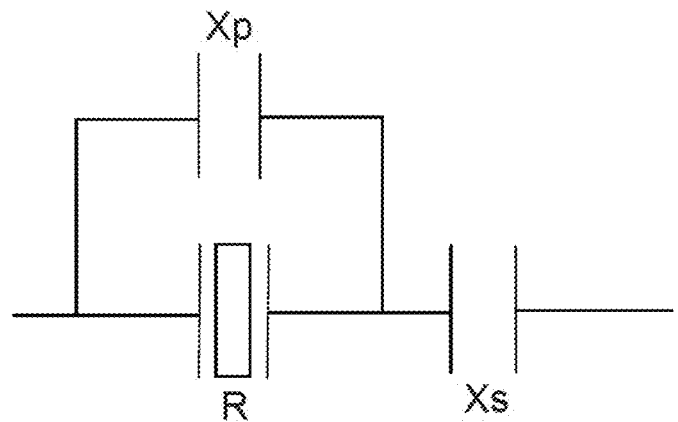
FIG. 8 illustrates a first example of an elementary building block used in the present invention in order to form the batch-produced filters.

First Example of an Elementary Building Block that may be used in the Present Invention:

The elementary building block of this example is shown in FIG. 8: it is composed of a resonator R, of a reactance (a capacitor in the example shown) Xp connected in parallel with the resonator, and another reactance (a capacitor in the example shown) Xs connected in series with the resonator. It should be noted that the reactances connected in series or in parallel with the resonator may be inductors. It is also possible to envisage combining capacitors and inductors while keeping the assembly joined to the resonator reactive overall.

Figure 9:
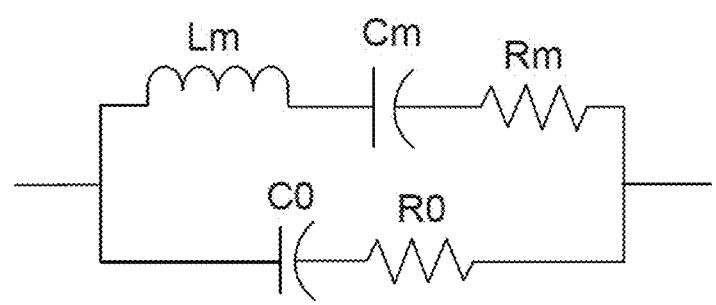
FIG. 9 illustrates the equivalent circuit diagram of a resonator referred to as a modified Butterworth-Van Dyke resonator.

In general, the impedance Zr of an electromechanical resonator is characterized, regardless of its nature (SAW, BAW, Lamb, etc.) and in a first approach, by the impedance of its equivalent model, referred to as a Butterworth-Van Dyke model and shown in FIG. 9, and given, ignoring losses, by the relationship:

$$Z_r = \frac{1}{Y_r}$$

where $$Y_r = j\omega \left( \frac{L_m C_m C_0 \omega^2 - C_0 - C_m}{L_m C_m \omega^2 - 1} \right)$$

Figure 10:
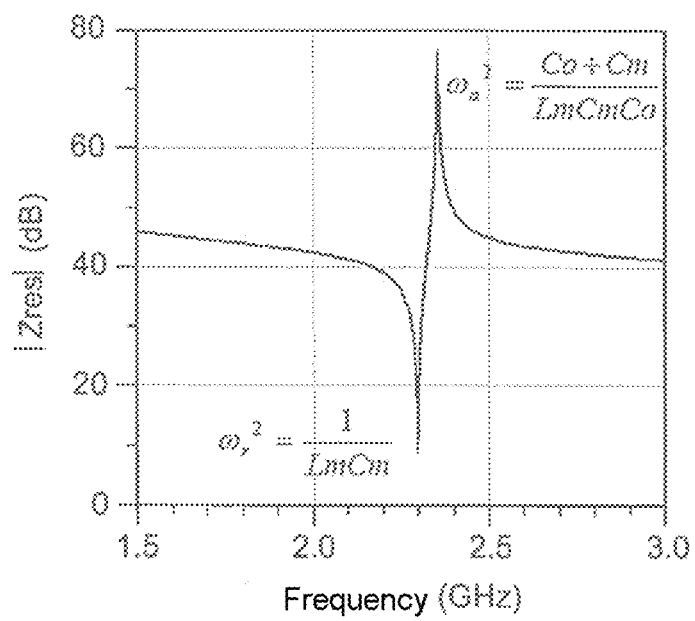
FIG. 10 illustrates the definition of the resonant and antiresonant frequencies of a piezoelectric resonator in relation to the equivalent circuit diagram of the modified Butterworth-Van Dyke resonator.

The curve of FIG. 10 corresponds to the plot of the impedance as defined by the formula above.

The components of the motional branch ($L_m$, $C_m$ and $R_m$) are linked to the acoustic resonance and hence to the characteristics of the technological stack of the resonator, while the electrostatic branch ($C_0$) is linked to the geometrical dimensions of the resonator.

For this reason, the values of the elements of the motional branch are calculated so as to account for the resonant $\omega_r$ and antiresonant $\omega_a$ frequencies according to the following equations:

$$\omega_r^2 = \frac{1}{L_m C_m} \quad \omega_a^2 = \frac{C_0 + C_m}{L_m C_m C_0} = \omega_r^2 (1 + r)$$

where $$r = \frac{C_m}{C_0}$$

Furthermore, the characteristic impedance $Z_C$ of the resonator outside of noteworthy frequencies may be defined by omitting the piezoelectric effect, $Z_C$ then corresponding to the impedance of a capacitor of capacitance $C_0$.

In a simplified manner, it is therefore possible to express the electrical response of a resonator on the basis of the characteristic impedance (or admittance) of the resonator.

$$Y_r = jC_0\omega \left( 1 + \frac{r}{1 - \left(\frac{\omega}{\omega_r}\right)^2} \right) = Y_C \left( 1 + \frac{r}{1 - \left(\frac{\omega}{\omega_r}\right)^2} \right)$$

Where $Y_c = jC_0\omega$ is the admittance of the electrostatic branch only, and hence the quantity fixing the characteristic impedance of the resonator.

When components are connected in series and in parallel with this resonator, a new impedance $Z_{eq}$ is obtained, characterized by new resonant and antiresonant frequencies and a new characteristic impedance.

Letting $Y_{eq}$ denote the equivalent admittance of the assembly composed of a resonator of characteristic admittance $Y_C$, of frequency $\omega_r$ and two admittance elements Yp and Ys that are connected in series and in parallel, respectively, the following is obtained:

$$Y_{eq} = \frac{Y_S\left(Y_P + Y_C\left(1 + \frac{r}{1 - \left(\frac{\omega}{\omega_r}\right)^2}\right)\right)}{Y_S + Y_P + Y_C\left(1 + \frac{r}{1 - \left(\frac{\omega}{\omega_r}\right)^2}\right)}$$

The characteristic admittance of this assembly is obtained when the high-frequency response is observed (as for a simple resonator):

$$Y_{C,eq} = \frac{Y_S(Y_P + Y_C)}{Y_S + Y_P + Y_C}$$

The effective resonant frequency is characterized by a cancellation of the denominator of $Y_{eq}$ and therefore corresponds to:

$$\omega_{r,eq} = \omega_r\sqrt{1 + \frac{r \cdot Y_C}{Y_S + Y_P + Y_C}}$$

Similarily, the effective antiresonant frequency is characterized by a cancellation of the numerator of Yeq and therefore corresponds to:

$$\omega_{a,eq} = \omega_r\sqrt{1 + \frac{r \cdot Y_C}{Y_P + Y_C}}$$

These latter three equations show that, on the basis of an actual resonator having given natural resonant and antiresonant frequencies, it is possible to generate, by means of:

adequate dimensioning of the static capacitance (obtained by defining the active area of the resonator for a BAW resonator, or the number of interdigitated combs for a SAW resonator) and by means of;

adding reactive elements in series and in parallel (adding non-reactive elements leads to complex resonant and antiresonant frequencies, i.e. to a lossy resonator), any equivalent resonator response having chosen equivalent resonant and antiresonant frequencies and impedance.

Stated otherwise, there is always a unique set of parameters (Yc, Ys and Yp) making it possible to set up an equivalent resonator having a chosen triplet ($Y_{c,eq}$, $\omega_{r,eq}$ and $\omega_{a,eq}$).

Hence, by varying the geometrical dimensions of the resonator and the values of the series and parallel reactances, it is possible to freely position a pole and a zero, which are associated with a chosen characteristic impedance.

Associating a Resonator with Series and Parallel Capacitors:

The most natural case is that in which a resonator is associated with one capacitor in series and with another in parallel. Equations (1), (2) and (3) are simplified in this case:

$$\omega_{r,eq} = \omega_r\sqrt{1 + r \cdot \frac{C_0}{C_0 + C_p + C_s}} \quad \omega_{a,eq} = \omega_r\sqrt{1 + r \cdot \frac{C_0}{C_0 + C_p}}$$

Furthermore, this basic building block has a characteristic impedance $Z_{C,eq}$ that is different from that of the original resonator, characterized by an equivalent static capacitance that is equal to:

$$C_{0,eq} = \frac{(C_0 + C_p) \cdot C_s}{C_0 + C_p + C_s}$$

The operating range of these parameters is limited to positive values of C0, Cs and Cp. Moreover, the resonant and antiresonant frequency values that can be attained are limited to within the range between the resonant and antiresonant frequencies of the original resonator.

Similarly, it is possible to simplify the equations of other configurations associating a resonator with reactive elements, in order to bring other potential solutions to light.

Associating a Resonator with Series and Parallel Inductors:

In a manner similar to the above, the equivalent resonant and antiresonant frequencies are obtained by means of equations (2) and (3), where Ys and Yp are the admittances of the series and parallel inductors. By means of a few calculations, the following is obtained:

$$\omega_{r,eq} = \sqrt{\frac{1}{2}\left(\frac{1}{L_{//}C_0} + \omega_a^2\right)\left(1 \pm \sqrt{1 - \left(\frac{4\omega_r^2}{1 + \omega_a^2 L_{//}C_0}\right)^2}\right)},$$

$$\omega_{a,eq} = \sqrt{\frac{1}{2}\left(\frac{1}{L_p C_0} + 1 + r\right)\left(1 \pm \sqrt{1 - \frac{4\omega_r^2}{\left(\frac{1}{L_p C_0} + 1 + r\right)^2}}\right)},$$

$$C_{0,eq} = \frac{1 - L_p C_0 \omega^2}{\frac{L_p + L_s}{L_p C_0}\left(1 - \frac{\omega^2}{L_{//}C_0}\right)},$$

where $$L_{//} = \frac{L_p \cdot L_s}{L_p + L_s}.$$

It is found that it is still possible to write the equations allowing ($C_{0,eq}$, $\omega_{r,eq}$ and $\omega_{a,eq}$) to be determined as a function of ($C_0$, Ls, $L_p$).

However, in this case, two resonant and antiresonant frequency solutions are possible, caused by a duplication of the resonance. Moreover, the equivalent static capacitance now depends on the frequency, and has a pole at the resonant frequency of the circuit formed by the static capacitance of the resonator and the joined inductors. For this reason, this type of circuit is not favored.

Associating a Resonator with a Series Inductor and a Parallel Capacitor:

In a manner similar to the above, the following is obtained in this case:

$$\omega_{r,eq} = \sqrt{\frac{1 \pm \sqrt{1 - \frac{4L_s(C_0 + C_p)\omega_r^2}{(1 + L_s C_0 \omega_a^2)^2}}}{2L_s(C_0 + C_p)}},$$

$$\omega_{a,eq} = \omega_r \cdot \sqrt{1 + r \cdot \frac{C_0}{C_0 + C_p}},$$

$$C_{0,eq} = \frac{C_0 + C_p}{1 - L_s \cdot (C_0 + C_p)\omega^2}.$$

The antiresonant frequency therefore depends only on the parallel capacitor, while the resonant frequency is sensitive to both added components. Furthermore, the resonant frequency is duplicate, and the equivalent static capacitance depends on the frequency. As in the preceding case, this association is not favored.

Associating a Resonator with a Series Capacitor and a Parallel Inductor:

In a manner similar to the above, the resonant and antiresonant frequencies are obtained by canceling out the numerator and the denominator, respectively, of equation (1). The following is obtained in this case:

$$\omega_{r,eq} \sqrt{\frac{1 + L_p(C_0 \omega_a^2 + C_s \omega_r^2)}{2L_p(C_0 + C_s)}\left(1 \pm \sqrt{1 - \frac{4L_p(C_0 + C_2)\omega_r^2}{(1 + L_p(C_0 \omega_a^2 + C_s \omega_r^2))^2}}\right)},$$

$$\omega_{a,eq} = \sqrt{\left(\omega_a^2 + \frac{1}{L_p C_0}\right)\left(1 \pm \sqrt{1 - 4\frac{L_p C_0 \omega_r^2}{(1 + L_p C_0 \omega_a^2)^2}}\right)}$$

$$C_{0,eq} = C_s \frac{\omega^2 L_p C_0 - 1}{\omega^2 L_p(C_0 + C_s) - 1}$$

It is found that this configuration also produces duplicate resonances and antiresonances. Furthermore and again, the equivalent static capacitance depends on the frequency and has a frequency range for which it becomes negative.

Figure 11:
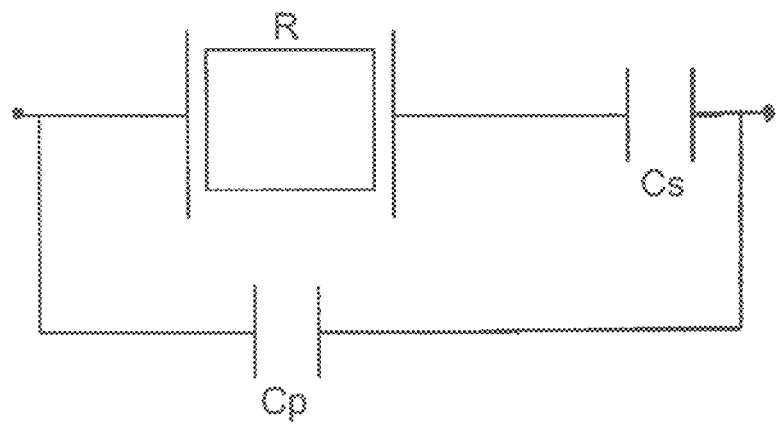
FIG. 11 illustrates a second example of an elementary building block used in the present invention in order to form the batch-produced filters.

Second Example of an Elementary Building Block that may be used in the Present Invention:

It should be noted that the configuration of FIG. 8 is not the only configuration liable to exhibit the type of behavior described above. It is also possible to envisage another example of an elementary building block. For example, if it is considered that the reactive element connected in parallel with the resonator is instead this time connected in parallel with the series association of the resonator and the reactive element connected in series, the diagram of FIG. 11 may be obtained.

Throughout the rest of the description and without losing generality, the developments are dealt with below according to the case that is the most useful in practice, i.e. that in which two capacitors are added to the resonator.

In this case, the equivalent impedance of the assembly is written as:

$$Y_{eq} = \frac{1}{\frac{1}{Y_c\left(1 + \frac{r}{1 - \left(\frac{\omega}{\omega_r}\right)^2}\right)} + \frac{1}{Y_s}} + Y_p$$

And in this case it is shown that:

$$\omega_{r,eq} = \omega_r \sqrt{1 + \frac{1}{\gamma} \cdot \frac{C_0}{C_0 + C_s}}$$

$$\omega_{a,eq} = \omega_r \sqrt{1 + \frac{1}{\gamma} \cdot \frac{C_0}{C_0 + \frac{C_s C_p}{C_s + C_p}}}$$

$$C_{0,eq} = \frac{C_s + C_p}{C_s + C_0} \cdot \left(C_0 + \frac{C_s C_p}{C_s + C_p}\right)$$

These expressions are sufficiently close to those obtained in the development of solution (1) to be able to draw the same theoretical conclusions.

Thus, in light of the preceding developments, it is possible, according to the present invention, to define the following main steps of the method for the batch production of a set of N filters $F_i$, where $1 \leq i \leq N$, each acoustic wave filter comprising j actual acoustic wave resonators $R_{ij}$, where $1 \leq j \leq M_i$, and comprising center frequencies $f_i$ and bandwidths $I_i$, which are different for at least two of them.

Advantageously, the filters may all be produced on one and the same chip and associated with parallel and series reactances, according to the design steps summarized below:

Step 1: in this first step, N theoretical filters are synthesized, each filter being defined on the basis of a set of j theoretical resonator(s), where $1 \leq j \leq M_i$, such that said theoretical filters have said center frequencies $f_i$ and said bandwidths $I_i$, the theoretical resonators of each filter respectively having a triplet of parameters: a theoretical static capacitance $C_{0ij,eq}$, a theoretical resonant frequency $\omega_{rij,eq}$ and a theoretical antiresonant frequency $\omega_{aij,eq}$, these parameters being grouped into one or more subsets.

Step 2: a stack allowing all of these resonators to be formed is produced. By means of techniques known to those skilled in the art, the designer produces a reference resonator structure for each subset allowing a resonator to be produced that naturally has a resonant frequency that is lower than the lowest of the desired theoretical resonant frequencies $\omega_{rij,eq}$ and an antiresonant frequency that is higher than the highest of the desired theoretical antiresonant frequencies $\omega_{aij,eq}$.

Step 3: An elementary building block is determined for each theoretical resonator of each subset, which building block comprises an intermediate resonator $R'_{ij}$, a parallel reactance $Xp_{ij}$ and/or a series reactance $Xs_{ij}$, the intermediate resonator $R'_{ij}$ having a static capacitance $C_{0ij}$, a resonant frequency $\omega_{r,ref}$ and an antiresonant frequency $\omega_{a,ref}$; the parameters $C_{0ij}$, $Xp_{ij}$ and/or $Xs_{ij}$ being defined such that the elementary building block has a static capacitance $C_{0ij,eq}$, a resonant frequency $\omega_{rij,eq}$ and an antiresonant frequency $\omega_{aij,eq}$.

Step 4: The geometrical dimensions of the actual resonators $R_{ij}$ of the filters are defined on the basis of the geometrical dimensions of the reference resonator structure such that they respectively have the capacitance $C_{Oij}$ of the intermediate resonator $R'_{ij}$.

First Example of Batch Production Using Bulk Wave Filters:

In this example, the applicant has produced, on one and the same chip, the eight transmission and reception filters of four duplexers in accordance with the LTE protocol in bands 28, 17, 13 and 5. The center frequencies and bandwidths of each of the transmission and reception filters for these bands are summarized in Table T1. In order to simplify the design phase, a single filter architecture is used for these eight frequency bands.

TABLE T1

| Band | Center frequency Transmission | Reception | Bandwidth |
|---|---|---|---|
| 28 | 725.5 MHz | 780.5 MHz | 45 MHz |
| 17 | 710 MHz | 740 MHz | 12 MHz |
| 13 | 782 MHz | 751 MHz | 10 MHz |
| 5 | 836.5 MHz | 881.5 MHz | 25 MHz |

Figure 12:
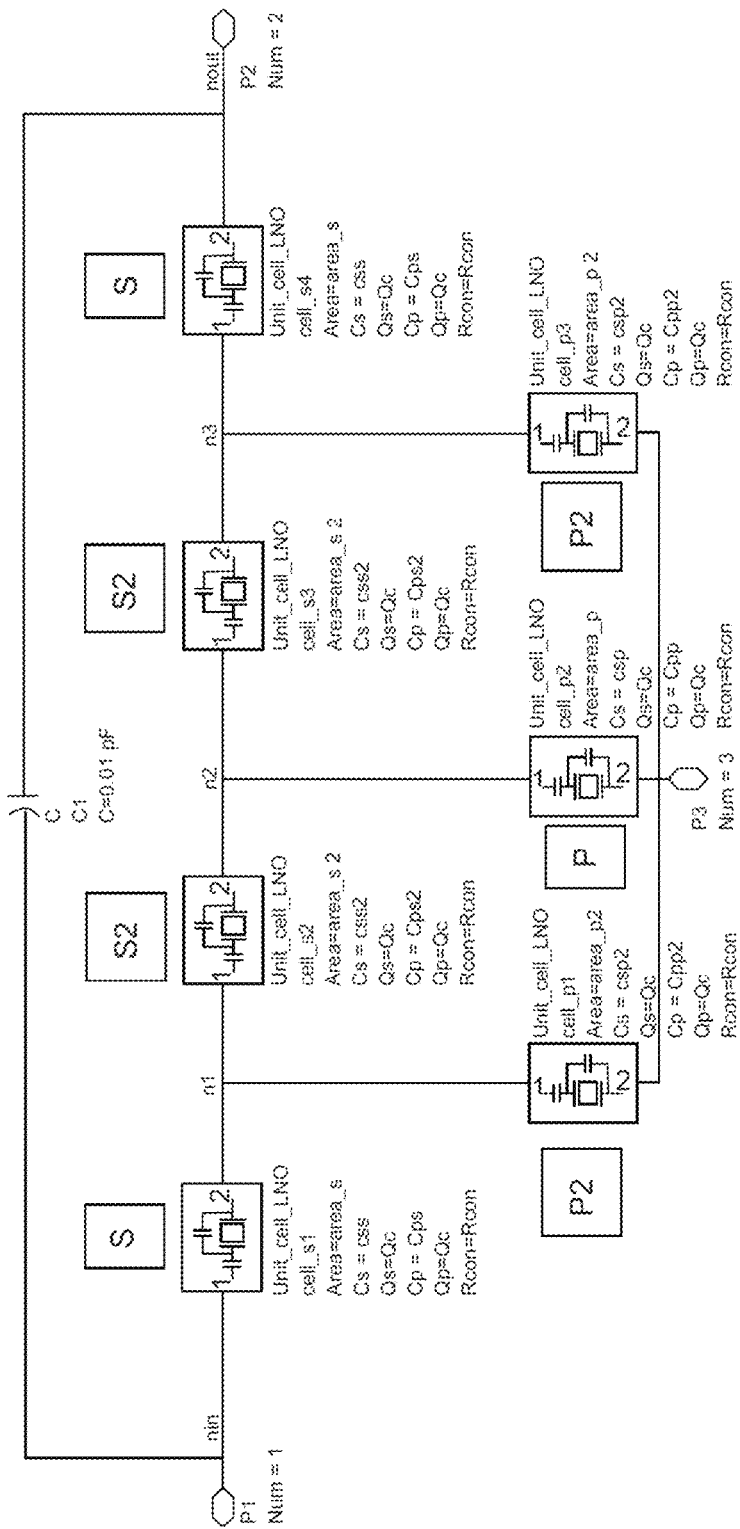
FIG. 12 illustrates the architecture of a ladder filter used for each filter in an exemplary embodiment of the present invention.

This architecture, illustrated in FIG. 12, consists of a ladder structure with three stages, each stage of which comprises a pair of elementary building blocks. A building block contains a resonator, characterized in particular by its static capacitance and its natural resonant and antiresonant frequencies. This building block also contains a series capacitor and a parallel capacitor. For each filter, it is possible to modify these three parameters in order to synthesize, one by one, the responses of each filter.

Figure 13:
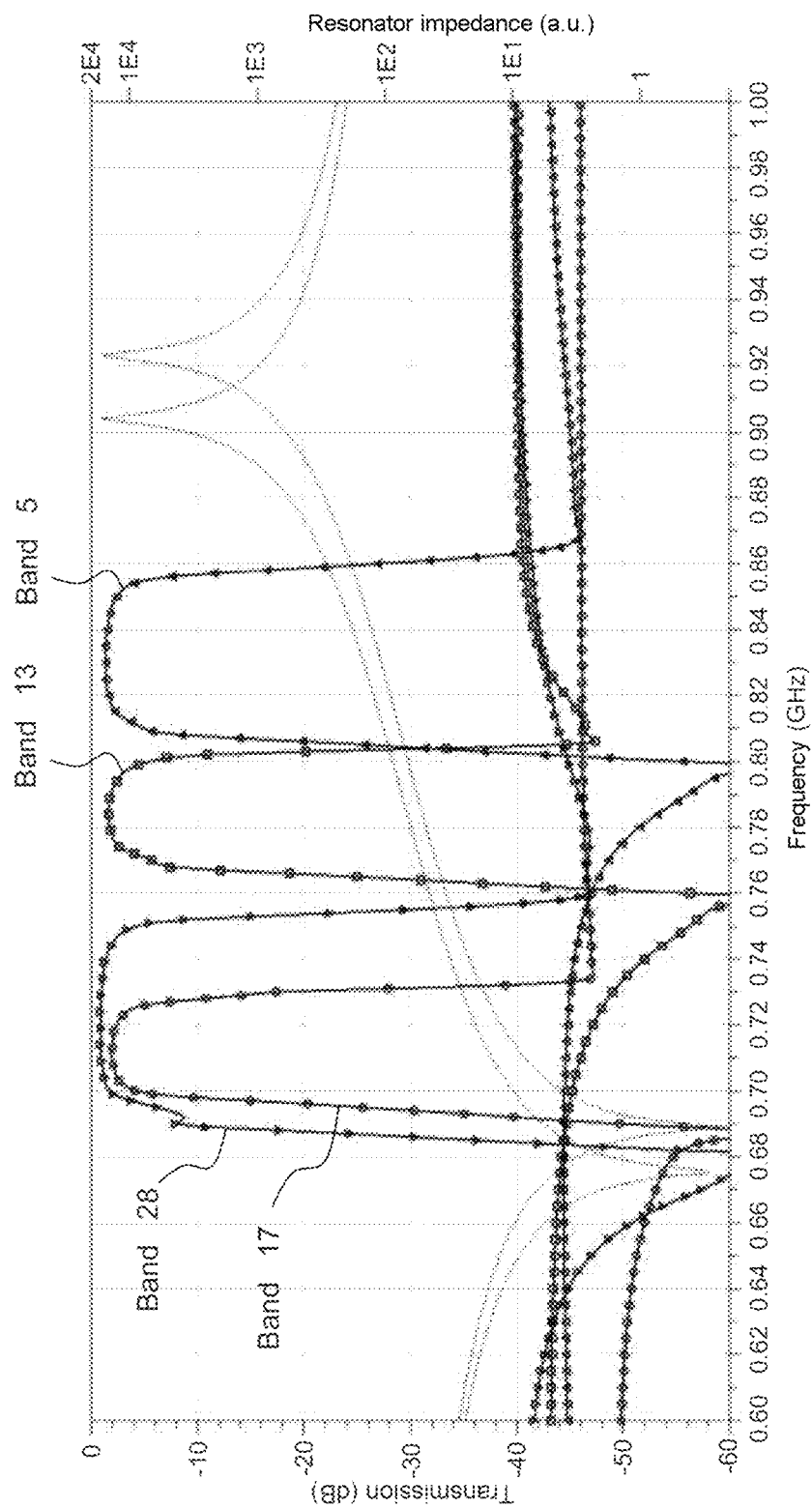
FIG. 13 illustrates the frequency response of the architecture of FIG. 12, configured for the bands TX 28, 17, 13 and 5 (scale on the left, in dB) and the frequency response of the doublet of resonators based on LNO, designed to produce these filters (scale on the right, in ohms)

The various production process steps of the present invention are followed as described below:

Step 1:

It is necessary to identify the triplets ($C_{Oeq}$, $\omega_{r,eq}$ and $\omega_{a,eq}$) specific to each building block of the architecture, in order to meet the required specifications. For example, FIG. 13 shows the response of the four transmission filters thus formed.

Table 2 summarizes the set of values obtained in the first optimization phase

TABLE T2

| TX filters | Elementary building blocks | $C_{Oeq}$ (pF) | $\omega_{r,eq}$ (MHz) | $\omega_{a,eq}$ (MHz) |
|---|---|---|---|---|
| Band 28 | S | 4.6 | 716 | 769 |
| | S2 | 1.7 | 720 | 759 |
| | P | 7.8 | 673 | 711 |
| | P2 | 9 | 673 | 716 |
| Band 17 | S | 3 | 713 | 738 |
| | S2 | 1.4 | 712 | 734 |
| | P | 14.4 | 673 | 715 |
| | P2 | 16.3 | 673 | 710 |
| Band 13 | S | 3.9 | 784 | 805 |
| | S2 | 2.1 | 783 | 805 |
| | P | 10.4 | 750 | 783 |
| | P2 | 10.5 | 750 | 784 |
| Band 5 | S | 2.7 | 827 | 871 |
| | S2 | 1.2 | 827 | 874 |
| | P | 8.3 | 790 | 826 |
| | P2 | 8.3 | 790 | 825 |

An identical operation is also carried out for the four reception filters, which allows a new set of values to be identified for each building block, summarized in Table T3 below:

TABLE T3

| TX filters | Elementary building blocks | $C_{Oeq}$ (pF) | $\omega_{r,eq}$ (MHz) | $\omega_{a,eq}$ (MHz) |
|---|---|---|---|---|
| Band 28 | S | 2.1 | 779 | 836 |
| | S2 | 1.1 | 778 | 842 |
| | P | 6.1 | 744 | 775 |
| | P2 | 8.8 | 722 | 777 |
| Band 17 | S | 3.4 | 744 | 774 |
| | S2 | 1.6 | 743 | 774 |
| | P | 6.6 | 714 | 742 |
| | P2 | 8.3 | 700 | 742 |
| Band 13 | S | 2.7 | 749 | 776 |
| | S2 | 1.3 | 749 | 775 |
| | P | 8.8 | 726 | 748 |
| | P2 | 9.3 | 726 | 748 |
| Band 5 | S | 2.1 | 878 | 919 |
| | S2 | 0.7 | 871 | 919 |
| | P | 9.1 | 838 | 877 |
| | P2 | 12.3 | 823 | 875 |

Step 2:

On the basis of these elementary building block specifications, the applicant synthesized a stack based on bulk wave resonators. These resonators must have a natural resonant frequency of less than 673 MHz (the lowest frequency of all of the elementary building blocks), and an antiresonant frequency of more than 919 MHz (the highest frequency of all of the elementary building blocks), i.e. an electromechanical coupling coefficient of more than 60%. In order to achieve this, the applicant considered these elementary building blocks as belonging to two subsets (series building blocks and parallel building blocks), and used a piezoelectric layer made of lithium niobate (X-orientation). The stack used is as follows:

Lower electrodes made of molybdenum: 190 nm thick
Lithium niobate (X-orientation): 1757 nm thick
Upper electrodes made of molybdenum: 150 nm thick
Passivation made of silicon nitride: 300 nm.

The frequencies of the resonators connected in series are differentiated from those of the resonators connected in parallel by using a localized mass overload, such as commonly used on bulk wave filters, for example, by means of an additional layer. This differentiation is obtained here by partially etching 100 nm, for example, from the passivation layer at the series resonators of the various filters. The electrical response of the pair of resonators thus produced is shown in FIG. 13, scale on the right. A frequency coverage that is compatible with the production of two subsets of elementary building blocks is thus ensured.

Steps 3 and 4:

Lastly, the equations presented above are used to calculate the areas of each resonator for each filter as well as the capacitance values of the series and parallel capacitors joined to each thereof. These values are grouped together in Tables T4 and T5 below:

TABLE T4

| TX filters | Elementary building block | Area resonator (μm²) | $C_0$ (pF) | $C_s$ (pF) | $C_p$ (pF) |
|---|---|---|---|---|---|
| Band 28 | S | 100 × 100 | 2.3 | 10.2 | 6 |
| | S2 | 60 × 60 | 0.8 | 5 | 1.8 |
| | P | 70 × 70 | 1.1 | ∞ | 6.7 |
| | P2 | 80 × 80 | 1.5 | ∞ | 7.5 |
| Band 17 | S | 70 × 70 | 1.1 | 5.7 | 5.2 |
| | S2 | 50 × 50 | 0.6 | 2.8 | 2.4 |
| | P | 100 × 100 | 2.3 | ∞ | 12.1 |
| | P2 | 100 × 100 | 2.3 | ∞ | 14 |

TABLE T4-continued

| TX filters | Elementary building block | Area resonator ($\mu m^2$) | $C_0$ (pF) | $C_s$ (pF) | $C_p$ (pF) |
|---|---|---|---|---|---|
| Band 13 | S | 200 × 200 | 9.2 | 4.9 | 10.4 |
| | S2 | 150 × 150 | 5.2 | 2.6 | 5.9 |
| | P | 250 × 250 | 14.3 | 15.2 | 18.1 |
| | P2 | 250 × 250 | 14.3 | 15.5 | 18 |
| Band 5 | S | 180 × 180 | 7.4 | 3.7 | 2.1 |
| | S2 | 125 × 125 | 3.6 | 1.7 | 1.1 |
| | P | 300 × 300 | 20.7 | 11.1 | 11.9 |
| | P2 | 300 × 300 | 20.7 | 11.2 | 12.1 |

TABLE T5

| TX filters | Elementary building block | Area resonator ($\mu m^2$) | $C_0$ (pF) | $C_s$ (pF) | $C_p$ (pF) |
|---|---|---|---|---|---|
| Band 28 | S | 115 × 115 | 3 | 3.8 | 1.8 |
| | S2 | 85 × 85 | 1.7 | 1.9 | 1.1 |
| | P | 185 × 185 | 7.8 | 9 | 11.5 |
| | P2 | 170 × 170 | 6.6 | 19.5 | 9.3 |
| Band 17 | S | 115 × 115 | 3 | 5.3 | 6 |
| | S2 | 80 × 80 | 1.5 | 2.5 | 2.9 |
| | P | 135 × 135 | 4.2 | 11.4 | 11.4 |
| | P2 | 125 × 125 | 3.6 | 22.2 | 9.7 |
| Band 13 | S | 115 × 115 | 3 | 3.9 | 5.9 |
| | S2 | 80 × 80 | 1.5 | 1.9 | 2.8 |
| | P | 190 × 190 | 8.3 | 12.8 | 20 |
| | P2 | 195 × 195 | 8.7 | 13.5 | 20.9 |
| Band 5 | S | 200 × 200 | 9.2 | 2.8 | 0 |
| | S2 | 125 × 125 | 3.6 | 0.9 | 0 |
| | P | 400 × 400 | 36.7 | 11.6 | 4.9 |
| | P2 | 400 × 400 | 36.7 | 17.3 | 5.3 |

It should be noted that the resonators of the parallel branches of the transmission filters covering bands 28 and 17 do not have a series capacitor, since in this case direct use is made of the natural resonant frequency of the technological stack, which was positioned at 673 MHz, i.e. below these two bands.

In a similar manner, the reception filter in band 5 does not have a capacitor in parallel to the series resonators. The upper edge of this band is effectively positioned on the natural antiresonant frequency of the technological stack, namely 919 MHz.

It has therefore been shown that the same technological stack allows the transmission and reception filters of four complete duplexers, namely eight different filters, to be produced conjointly.

Figure 14:
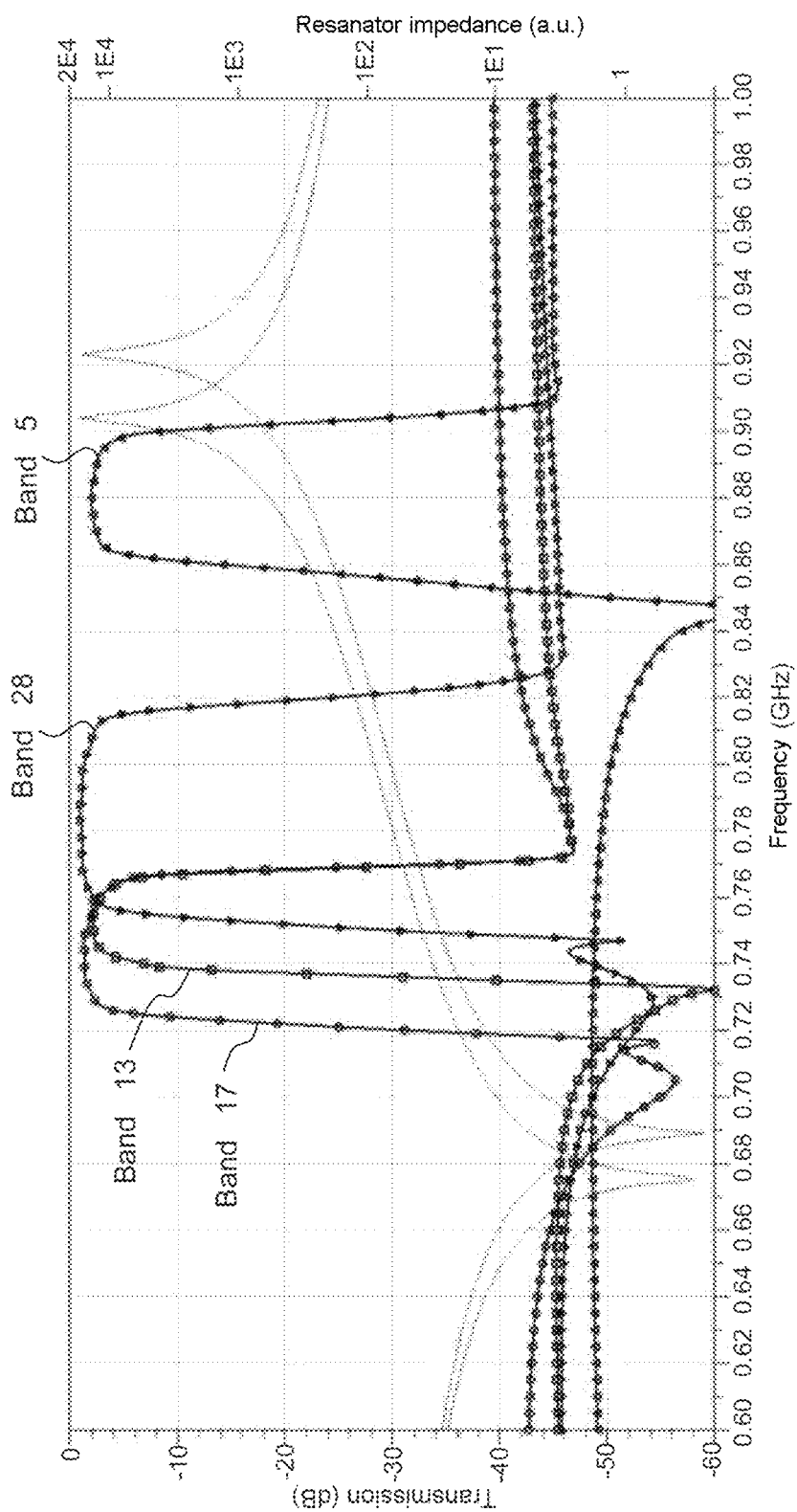
FIG. 14 illustrates the frequency response of the architecture of FIG. 12, configured for the bands RX 28, 17, 13 and 5 (scale on the left, in dB) and the frequency response of the doublet of resonators based on LNO, designed to produce all of these filters (scale on the right, in ohms)

The response of these filters is shown in FIGS. 13 and 14.

2) Co-Integration of the Reactances with the Resonators:

The most natural way in which to produce these filters consists of first producing the various resonators of these various filters on one chip and then transferring this chip to a second chip dedicated to the production of passive components, in particular the capacitors required for the filter circuit. Proceeding in this way makes it possible to benefit from technologies optimized for the production of capacitors and hence not to have to strike a compromise between capacitor, resonator and filter performance.

It has however been shown in the field of AlN bulk acoustic wave filters that considerable area gains could be expected by co-integrating capacitors with the resonators of a filter. The article by A. Volatier, G. Fattinger, F. Dumont, P. Stoyanov, R. Aigner, *Technology enhancements for high performance BAW duplexer*, Proceedings of the 2013 Joint UFFC, EFTF and PFM Symposium, p. 761, presents for example the production of capacitors by using the dielectric layers of the Bragg mirrors of SMR-type resonators.

Furthermore, it may be noted that equations (2) and (3) may easily be rewritten by normalizing the admittances Ys and Yp with respect to $C_0$. Stated otherwise, the resonant and antiresonant frequencies are set by the ratio between the capacitance values of the capacitors connected in series and in parallel to the resonator, and the static capacitance of this resonator. As the latter is set by the thickness of the piezoelectric layer in the case of bulk wave devices, it is sensitive to any variation in thickness occurring during the fabrication process. This will therefore lead to frequency variations. In order to overcome this issue, the applicant has already proposed and described, in the patent application FR 2 99 60 61, the production of these capacitors on the basis of the same piezoelectric layer, simply by locally modifying the stack.

In order to achieve this, the resonators are produced on the basis of a lower electrode/piezoelectric layer/upper electrode/passivation layer stack produced above a free cavity. In proximity to these resonators, the capacitors allowing the resonant and antiresonant frequencies to be positioned are produced on the basis of a bonding layer/lower electrode/ piezoelectric layer/upper electrode/over-metallization stack produced directly on the substrate so as to attenuate the acoustic resonances that may be generated.

Likewise, the sacrificed layer and over-metallization thicknesses are selected so as to push these attenuated acoustic resonances into frequency zones where they can be ignored, as indicated in the patent application FR 2 99 60 61.

Figure 15:
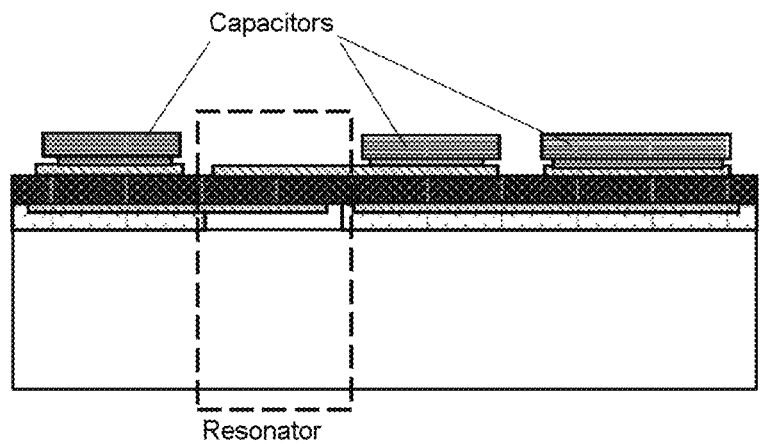
FIG. 15 illustrates a schematic view in cross section of a portion of a filter including a resonator and three co-integrated capacitors according to the method of the invention.
Figure 16:
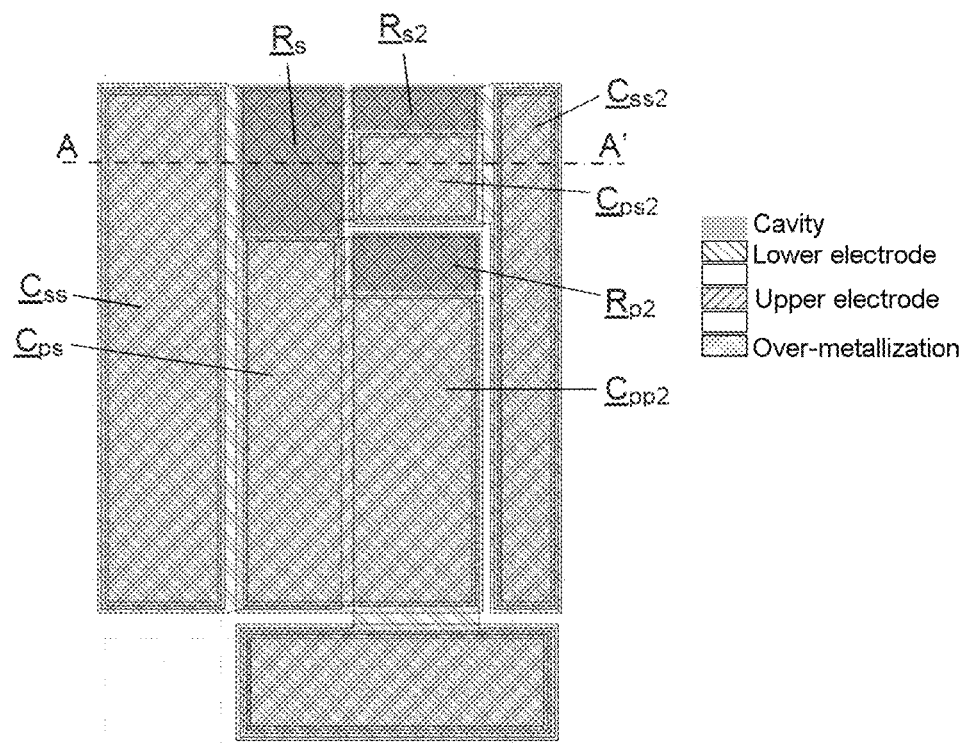
FIG. 16 illustrates a schematic view from above of a portion of the transmission filter of the band 28 and produced by co-integrating the capacitors and the resonators.

FIG. 15 shows a schematic view in cross section of a portion of a filter including a resonator and three co-integrated capacitors. This view corresponds to the cross section denoted by AA' in FIG. 16 which represents a view of a portion of the transmission filter of band 28 comprising the blocks S, S2 and P2 of the diagram of FIG. 13. The resonators of each of the blocks are referenced, Rs, Rs2 and Rp2, respectively, the series capacitors are referenced Css and Css2 (the block P2 does not have a series capacitor), and the parallel capacitors are referenced Cps, Cps2 and Cpp2.

Second Example of Batch Production Using Surface Acoustic Wave Filters:

The present invention is also advantageous for the co-integration of surface acoustic wave filters. It may seem trivial to co-integrate SAW filters on one and the same chip, those skilled in the art tending to modify the period of the interdigitated combs so as to obtain resonators having different resonant and antiresonant frequencies for each of the co-integrated filters.

Nevertheless, in this case, if the electrodes of these various resonators are produced on the basis of the same metal layer, it will result in metal thickness/wavelength ratios that differ from one filter to another, thereby affecting the propagation conditions of the acoustic waves under the arrays of electrodes, and risk making them less than optimal for some of the filters.

Conversely, according to the optimization by the applicant, all of the resonators of the various filters to be co-integrated may be produced on the basis of resonators all having the same period of interdigitated combs, and therefore all operating with the same metal thickness/wavelength ratio. Thus, all of the resonators use the same propagation conditions, thereby obviating the need for specific optimization from one filter to another.

In order to illustrate the application of the present invention to the case of surface acoustic wave filters, the use of surface waves of Love type propagating on the surface of a $LiNbO_3$ substrate of cut (YXl)/15° is considered, as employed in the article by T. Komatsu, K. Y. Hashimoto, T.

Omori, M. Yamaguchi, *Tunable radio-frequency filters using acoustic wave resonators and variable capacitors*, Japanese Journal of Applied Physics 49, 2010, and reprising the various steps of the method of the invention.

Insofar as the same set of filters as above is designed to obtain the same frequency bands, it is possible to start from the filter design produced for the first example, and hence from the resonator specifications provided in Table T2 and Table T3.

A surface acoustic wave resonator is dimensioned by setting the following parameters:

Electrodes: copper, 360 nm thick;

Interdigitated combs: 2.39 µm period, metallization ratio of 0.5.

The use of copper electrodes is necessary in order to have very dense electrodes that will slow the surface waves by a considerable amount, so as to better guide them along the surface of the piezoelectric substrate and thus prevent them radiating into the substrate. The combination of metal thickness, its metallization ratio and the period of the interdigitated combs allows the electromechanical coupling coefficient to be maximized at 32%. This makes it possible to have a resonant frequency localized at 673 MHz and an antiresonant frequency at 773 MHz.

These conditions are similar to those of the preceding example, despite the electromechanical coupling coefficient being smaller. According to Table T2 and Table T3, it is possible to cover only transmission bands 28 and 17. For these two bands, the resonators are dimensioned so as to have the static capacitances required to synthesize the resonators for transmission bands 28 and 17 listed in Table T2 and Table T3. This is achieved by adjusting the length of overlap between teeth, as well as the number of electrodes, according to techniques known to those skilled in the art.

This example makes it apparent that a smaller electromechanical coupling coefficient quickly limits the number of bands that can be covered.

Third Example of Batch Production Using Plate Wave Filters:

A third embodiment consists of producing the preceding filters by using plate waves. These waves propagate through a thin film of piezoelectric material. Remaining with the case of lithium niobate, a particularly advantageous crystal orientation for the purpose of maximizing the electromechanical coupling coefficients of these plate waves is the cut referred to as (YXI)/30°. This orientation allows the excitation of waves referred to as SH0 (shear horizontal zero-order) waves, which have an electromechanical coupling coefficient reaching 55% when the thickness of the plate is close to one tenth of the wavelength as described in the article by M. Kadota, S. Tanaka, Y. Kuratani, T. Kimura, *Ultra wide band ladder filter using SH0 plate wave in thin LiNbO$_3$ plate and its application*, Proceedings of the 2014 IEEE International Ultrasonics Symposium, pp. 2031-2034.

As above, the implementational procedure differs from the first example only in the second step: the definition of the resonator. As mentioned in the article cited above, the resonator consists of a film of lithium niobate of cut (YXI)/30° added to silicon and suspended above a cavity machined into the substrate. The waves are excited by interdigitated combs made of aluminum, which are positioned on the upper surface of the film and have a width of 1.4 µm and a period of 2.75 µm, the thickness of the film itself being 550 nm and the thickness of the electrodes being 80 nm. A resonator produced according to these geometrical parameters has a resonant frequency of close to 664 MHz and an antiresonant frequency of close to 824 MHz, and hence an electromechanical coupling coefficient of the order of 48%.

These conditions are more favorable than in the preceding example, since they allow, according to Table T2 and Table T3, transmission bands 13, 17 and 28 and reception bands 13 and 17 to be covered.

For these five bands, the resonators are dimensioned so as to have the static capacitances required to synthesize the resonators for these five bands listed in Table T2 and Table T3. As above, this is achieved by adjusting the length of overlap between teeth, as well as the number of electrodes, according to techniques known to those skilled in the art.

Particular Advantages Afforded by the Invention

The present invention makes it possible to produce a bank of acoustic filters on one and the same chip.

While, in the production processes of the prior art, each separate filter requires its own technological stack and hence a different production batch, the invention allows one and the same production batch to be used for a substantial variety of filters. In this way the production process is optimized.

As a result, this approach makes it possible to minimize the number of different components to be assembled in order to produce the radiofrequency stage of a communication system and, at the same time, to minimize the area occupied by all of these components.

If the data of Table T4 are examined in greater detail, it is possible to estimate the size of a chip containing the eight filters presented by way of example, by assuming that the capacitors joined to the resonators are positioned on a separate chip, positioned opposite (interposer or active circuit). By reprising the resonator areas given above and considering the technological margins and the dimensions of the various associated interconnects, the total area occupied by the eight filters may be calculated as approximately 2.5 mm$^2$. This is to be compared with the dimensions of an individual duplexer (a pair of filters), at around 1.5 mm$^2$ in the best case, for these frequency bands. It can therefore be seen that the co-integration of the various filters of the four duplexers in question on one and the same chip allows a substantial area to be gained.

The invention claimed is:

1. A method for a batch production of a set of N filters $F_i$, where $1 \leq i \leq N$ each acoustic wave filter comprising $M_i$ actual acoustic wave resonators $R_{ij}$, where $1 \leq j \leq M_i$, and comprising center frequencies $f_i$ and bandwidths $l_i$, which are different for at least two of them, comprising the following steps:

synthesizing N theoretical filters, each filter being defined on the basis of a set of $M_i$ theoretical resonator(s), where $1 \leq i \leq N$, such that said theoretical filters have said center frequencies $f_i$ and said bandwidths $l_i$, the theoretical resonators of each filter respectively having a triplet of parameters: a theoretical static capacitance $C_{0ij,eq}$ where $1 \leq j \leq M_j$, a theoretical resonant frequency $\omega r_{ij,eq}$ and a theoretical antiresonant frequency $\omega_{aij,eq}$, these parameters being grouped into one or more subsets;

determining a reference resonator structure for each subset such that said reference resonator naturally has a resonant frequency $\omega_{r,ref}$ that is lower than the lowest of the theoretical resonant frequencies $\omega_{rij,eq}$ of said subset and an antiresonant frequency $\omega_{a,ref}$ that is higher than the highest of the theoretical antiresonant frequencies $\omega_{aij,eq}$ of said subset;

determining, subsequent to the preceding step for each theoretical resonator of each subset, an elementary building block comprising an intermediate resonator $R'_{ij}$, at least one of a parallel reactance $Xp_{ij}$ associated with the actual acoustic wave resonators $R_{ij}$ to form the elementary building blocks and a series reactance $Xs_{ij}$ associated with the actual acoustic wave resonators $R_{ij}$ to form the elementary building blocks, the intermediate resonator $R'_{ij}$ having a static capacitance $C_{0ij}$, the resonant frequency $\omega_{r,ref}$ and the antiresonant frequency $\omega_{a,ref}$ parameters of at least one of the static capacitance $C_{0ij}$, the parallel reactance $Xp_{ij}$ and the series reactance $Xs_{ij}$ being defined such that the elementary building block has the static capacitance that is equal to the theoretical static capacitance $C_{0ij,eq}$, the resonant frequency that is equal to the theoretical resonant frequency $\omega_{rij,eq}$ and the antiresonant frequency that is equal to the theoretical antiresonant frequency $\omega_{aij,eq}$;

determining geometrical dimensions of the actual acoustic wave resonators of the filters base on geometrical dimensions of said reference resonator structure such that they respectively have the static capacitance $C_{0ij}$ of the intermediate resonator $R'_{ij}$;

producing each of said actual acoustic wave resonators.

2. The method for the batch production of the set of N filters $F_i$ as claimed in claim 1, wherein the elementary building block comprises a reactance connected in parallel which is connected, on the one hand, to an input/output terminal and, on the other hand, to an intermediate node between the intermediate resonator and a reactance connected in series.

3. The method for the batch production of the set of N filters $F_i$ as claimed in claim 1, wherein the elementary building block comprises a reactance connected in parallel with the series reactance and with the intermediate resonator.

* * * * *

UNITED STATES PATENT AND TRADEMARK OFFICE
CERTIFICATE OF CORRECTION

PATENT NO. : 10,727,802 B2  
APPLICATION NO. : 15/514525  
DATED : July 28, 2020  
INVENTOR(S) : Alexandre Reinhardt et al.

Page 1 of 1

It is certified that error appears in the above-identified patent and that said Letters Patent is hereby corrected as shown below:

In the Claims

In Claim 1, Column 20, Line 45 "and bandwidths $l_i$, which are different" should be -- and bandwidths $I_i$, which are different --.

In Claim 1, Column 20, Line 50 "and said bandwidths $l_i$," should be -- and said bandwidths $I_i$, --.

In Claim 1, Column 20, Line 53 "where $1 \leqq j \leqq M_j$," should be -- where $1 \leqq j \leqq M_i$, --.

In Claim 1, Column 21, Line 17 "wave resonators of the filters" should be -- wave resonators $M_{ij}$ of the filters --.

Signed and Sealed this  
Thirtieth Day of March, 2021

Drew Hirshfeld  
*Performing the Functions and Duties of the*  
*Under Secretary of Commerce for Intellectual Property and*  
*Director of the United States Patent and Trademark Office*